(12) United States Patent
Sirringhaus et al.

(10) Patent No.: US 7,407,849 B2
(45) Date of Patent: Aug. 5, 2008

(54) SELF-ALIGNED PRINTING

(75) Inventors: Henning Sirringhaus, Cambridge (GB); Michael J. Banach, Cambridge (GB); Nicholas Jim Stone, Cambridge (GB); David William Joseph Wilson, Cambridge (GB); John Devin Mackenzie, Cambridge, CA (US); Wilhelmus Theodorus Stefanus Huck, Cambridge (GB); Christoph Wilhelm Sele, Cambridge (GB)

(73) Assignees: Plastic Logic Limited, Cambridge (GB); Cambridge University Technical Services Limited, Cambridge (GB)

( * ) Notice: Subject to any disclaimer, the term of this patent is extended or adjusted under 35 U.S.C. 154(b) by 322 days.

(21) Appl. No.: 10/499,665

(22) PCT Filed: Dec. 20, 2002

(86) PCT No.: PCT/GB02/05863

§ 371 (c)(1),
(2), (4) Date: Mar. 9, 2005

(87) PCT Pub. No.: WO03/056641

PCT Pub. Date: Jul. 10, 2003

(65) Prior Publication Data

US 2005/0151820 A1 Jul. 14, 2005

(30) Foreign Application Priority Data

Dec. 21, 2001 (GB) ................................ 0130485.6

(51) Int. Cl.
*H01L 21/336* (2006.01)

(52) U.S. Cl. ........................................ 438/197; 438/478
(58) Field of Classification Search ................. 438/151, 438/197, 99, 159, 161, 164, 689, 780, 478; 257/288, 347
See application file for complete search history.

(56) References Cited

U.S. PATENT DOCUMENTS

| 6,810,814 B2 * | 11/2004 | Hasei | ......................... 101/485 |
| 2004/0029382 A1 * | 2/2004 | Kawase | ...................... 438/689 |

FOREIGN PATENT DOCUMENTS

| GB | 2 373 095 A | 9/2002 |
| WO | WO 01 47043 A | 6/2001 |
| WO | WO 01 47045 A | 6/2001 |

OTHER PUBLICATIONS

Kawase T. et al: "All-polymer thin film transistors fabricated by high-resolution ink-jet printing" International Electron Devices Meeting 2000. Technical Digest. IEDM (CAT No. 00CH37138), San Francisco, CA, USA, Dec. 10-13, 2000, pp. 623-626, XP002234841 2000 Piscataway, NJ,USA, IEE, USA ISBN: 0-7803-6438-4.

* cited by examiner

*Primary Examiner*—Tuan H Nguyen
(74) *Attorney, Agent, or Firm*—Sughrue Mion, PLLC

(57) ABSTRACT

A method for forming an organic or partly organic switching device. The method comprises depositing layers of conducting, semiconducting and/or insulating layers by solution processing and direct printing. Then, high-resolution patterns of electroactive polymers are formed by self-aligned formation of a surface energy barrier around a first pattern that repels the solution of a second material.

103 Claims, 21 Drawing Sheets

Printing Results: SDS and DD50 on neg. and pos. surfaces (a)

(b)

SELF-ALIGNED PRINTING

This invention relates to methods for depositing structures, for instance for forming organic electronic devices.

Semiconducting conjugated polymer thin-film transistors (TFTs) have recently become of interest for applications in cheap, logic circuits integrated on plastic substrates (C. Drury, et al., APL 73, 108 (1998)) and optoelectronic integrated devices and pixel transistor switches in high-resolution active-matrix displays (H. Sirringhaus, et al., Science 280, 1741 (1998), A. Dodabalapur, et al. Appl. Phys. Lett. 73, 142 (1998)). High-performance TFTs with charge carrier mobilities up to 0.1 $cm^2/Vs$ and ON-OFF current ratios of $10^6$-$10^8$ have been demonstrated. This is comparable to the performance of amorphous silicon TFTs (H. Sirringhaus, et al., Advances in Solid State Physics 39, 101 (1999)).

One of the advantages of polymer semiconductors is that they lend themselves to simple and low-cost solution processing. However, fabrication of all-polymer TFT devices and integrated circuits requires the ability to form lateral patterns of polymer conductors, semiconductors and insulators. Various patterning technologies such as photolithography (WO 99/10939 A2), screen printing (Z. Bao, et al., Chem. Mat. 9, 1299 (1997)), soft lithographic stamping (J. A. Rogers, Appl. Phys. Lett. 75, 1010 (1999)) and micromoulding (J. A. Rogers, Appl. Phys. Lett. 72, 2716 (1998)), as well as direct ink-jet printing (H. Sirringhaus, et al., UK 0009911.9) have been demonstrated.

Many direct printing techniques are unable to provide the patterning resolution that is required to define the source and drain electrodes of a TFT. In order to obtain adequate drive current and switching speed channel lengths of less than 10 μm are required. The speed of an integrated logic circuit is proportional to the mobility and the inverse square of the TFT channel length. By reducing the channel length by an order of magnitude, the operating speed can be enhanced by a factor on the order of 100. Definition of devices with submicrometer critical feature size is therefore highly desirable to achieve higher circuit performance.

Many direct printing techniques such as inkjet printing are not considered to be capable of achieving such high resolution. The droplets formed at the nozzles of an inkjet printer, for example, are emitted with statistical variations of flight direction caused by changing wetting conditions at the nozzle plate. When landing on the substrate the droplets spread in an uncontrolled way. Both factors would give rise to electrical shorts between two parallel, printed source and drain TFT electrodes with a short channel length of a few micrometers. In UK 0009915.0 this general resolution limitation of solution based direct printing approaches has been overcome by printing onto a prepatterned substrate containing regions of different surface free energy. Deposition of material deposited from a polar (non-polar) solvent, for example, only occurs in the hydrophilic (hydrophobic) regions of the substrate, and the spreading of droplets on the surface can be controlled by repulsive surface energy barriers that define the critical device dimensions. This technique has allowed for printing of TFT devices with accurately defined channels with channel lengths of less than 5 μm. Various methods to define the surface energy pattern can be used such as local exposure to a focussed infrared laser beam (see our co-pending UK patent application no. 0116174.4).

One of the disadvantages of achieving high-resolution printing with the help of a previously defined surface energy pattern is the need for an additional processing step in order to define such pattern with high resolution. For critical features of typically a few μm's a broad range of techniques for surface energy prepatterning can be used, but definition of critical features of submicrometer dimension becomes increasingly difficult and expensive.

According to the present invention there are provided methods and devices as set out in the accompanying claims.

Thus aspects of the present invention provide a method by which critical features of micrometer and submicrometer dimension separating a first and a second region of printed material can be defined without the help of a surface energy pattern. Such a method can be based on formation of a self-aligned surface coating layer formed on the surface of a printed pattern of a first material, and/or in a region of the substrate around a printed pattern of a first material. This surface coating layer results in the repulsion of a solution of a second material from the surface of the first material. The interaction of the solution of the second material with the surface coating layer around the first material can result in the formation of a small gap between the patterns of the first and second material.

The invention will now be described with reference to the following figures.

As described in more detail below, after the initial preparation of a substrate a first material can be deposited on the substrate. After further surface modification and solution formulation, there can be a second deposition of material and the formation of a high resolution feature. The following description also describes the implementation of this technique for forming short channel and thin gate transistor structures, and other electronic components and devices requiring critical features with dimensions less than 20 μm.

According to a first embodiment of the present invention there is provided a method by which a solution of a second material deposited in a second region of the substrate is repelled by the surface of a first material deposited previously in a first region.

Figure 1:
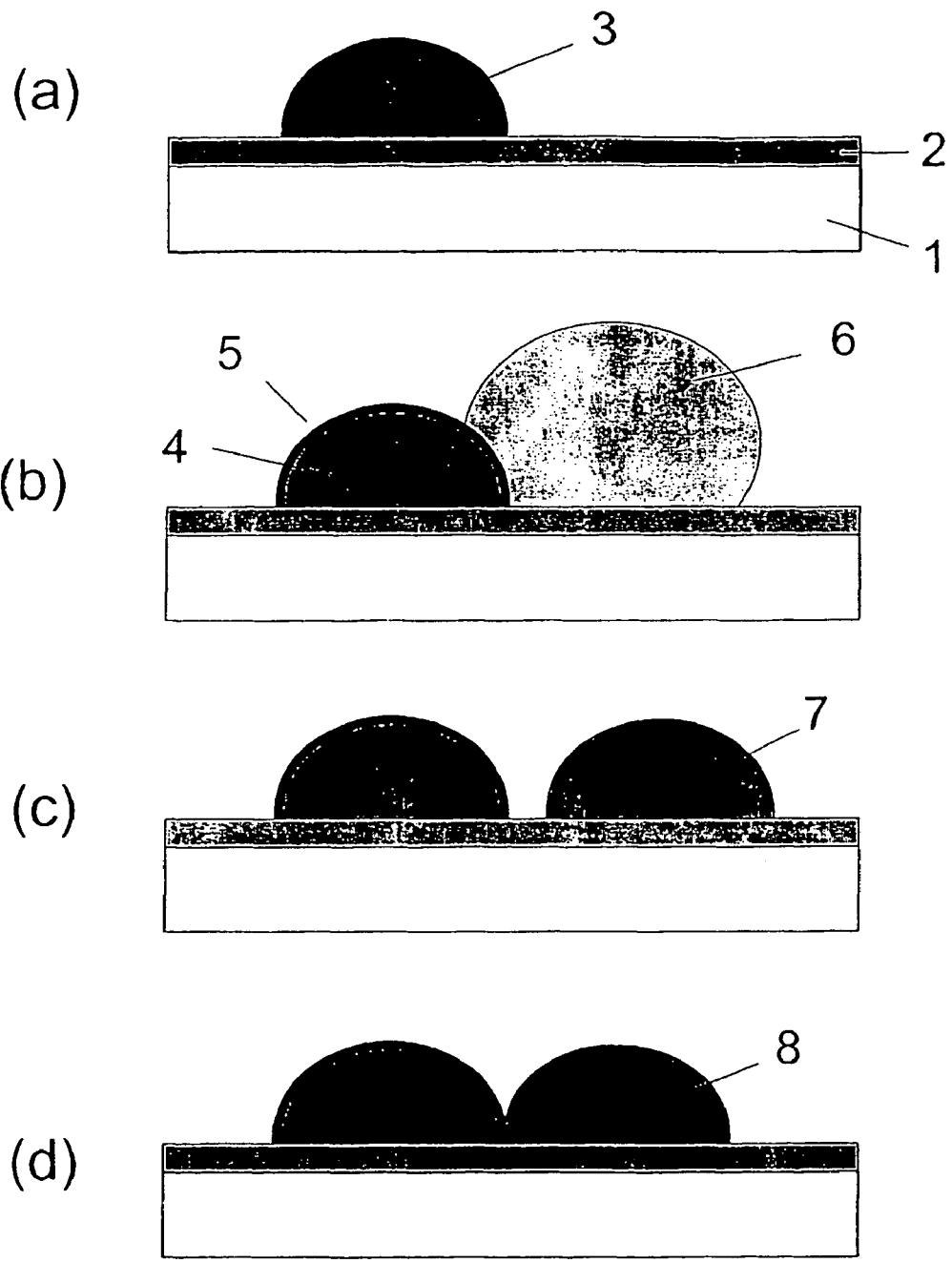
FIG. 1 shows the repulsion of the second solution from the region of the first material with a self-aligned surface coating layer.

FIG. 1 illustrates schematically this embodiment. The first material 3 is deposited first onto a substrate 1, preferably from solution. Any deposition technique that is capable of producing a pattern of the first material may be used. Examples of such techniques are inkjet deposition, spray coating, screen printing, offset printing, continuous film deposition followed by photolithographic patterning, solution casting or spray coating onto a substrate containing a surface energy pattern etc. During deposition or after deposition of the first material a self-aligned surface layer 5 is formed around the pattern of the first material 4. This surface layer is prepared in such a way that it is capable of repelling a solution 6 of a second material that is deposited in contact with the first material or restrict the flow of such a subsequently-deposited material to its boundary. The first material may be selected so that it inherently provides those properties. Alternatively the properties may be obtained by surface modification of the first material after deposition. The properties may be obtained by techniques following techniques for it may be surface modified to give it those by any one or more of a variety of techniques including, but not limited to the following.

(a) The solution of the second material can be chosen such that the surface of the first material has a natural tendency to repel the ink of the second material.
(b) Phase separation in the first material may result in formation of a surface composition that is different from the bulk composition of the first material.
(c) A post deposition surface reaction of the first material is induced when exposed to the vapour or liquid phase of a surface modifying agent.
(d) The solution of the first material is mixed with a component that has a tendency to segregate to the surface, i.e. a surfactant, or a molecule or polymer containing a low surface energy component
(e) A surface reaction is induced by exposure of the first material by exposure to electromagnetic radiation, or thermal treatment.

In the case of a post-deposition surface reaction carried out to modify the surface of the first material, the surface reaction needs to be selective, i.e. it should not result in modification of the substrate surface, or at least not to the same degree as it leads to modification of the surface of the first material. The second material is then deposited in such a way that the solution comes at least partially in contact with the surface of the first material. The solution of the second material is repelled from the first region, and upon drying no deposition of the second material 7 will occur in the first region. A small gap between the first and second material is defined when the second solution dries on the substrate surface.

In the following we discuss several examples of methods by which such repulsive interaction between the surface of the first material and the solution of the second material can be achieved.

If the first and second material are different, for example, if they have different polarities, the solution of the second material can be formulated in such a way that it has a higher contact angle on the surface of the first material than on the bare substrate, such that it will be repelled when getting into contact with the first material. For example, if the first material is a polar (non-polar) material soluble in a polar (non-polar) solvent, and the second material is a non-polar (polar) material, the second material can be formulated in a non-polar (polar) solvent, in which the first material is insoluble or only poorly soluble. Examples of such materials are the polar conducting polymer PEDOT/PSS formulated in water, and a non-polar semiconducting polymer such as poly dioctylfluorene-co-bithiophene (F8T2) formulated in a non-polar solvent such xylene.

If on the other hand the first and second material are the same or of similar polarity the surface repulsion of a solution of the second material can be achieved by selectively modifying the surface of the first material during or after deposition of the first material but prior to deposition of the second material.

Such selective surface modification can be achieved by a range of different techniques, including, but not limited to, reactive plasma treatment after deposition of the first material, the use of surfactants mixed into the solution of the first material, the mixing of the first material with a phase separating diblock copolymer, or the selective growth or deposition of material on the surface of the first material.

According to one embodiment of the invention (FIG. 2) plasma treatment involves the exposure of the surface to a gaseous reactive species such as carbon tetrafluoride ($CF_4$). Under suitable plasma condition surfaces of polymer materials can be modified selectively without simultaneous modification of the substrate surface. The surface of many hydrocarbon polymers, such as the conducting polymer polyethylenedioxythiophene doped with polystyrene sulphonate (PEDOT:PSS), or of the insulating polymer polyimide can be fluorinated selectively on a glass substrate (for example, Corning 7059) by exposure to a low energy $CF_4$ plasma while the surface of the glass substrate is affected to a lesser degree by the fluorination. The low-energy, fluorinated surface layer 12 around the first material 11, provides efficient repulsion of droplets of a second material 13, for example another solution of PEDOT/PSS deposited from water.

An alternative technique is to mix a surfactant into the solution of the first material. Surfactants are amphiphilic molecules that contain a polar/ionic, hydrophilic head group and a nonpolar, hydrophobic tail group. When a solution of a surfactant and solvent (such as water) is placed in contact with a surface, the surfactant segregates to the interface in order to form a monolayer interfacial layer. When the surface/interface is in contact with a nonpolar medium (i.e., for example in case of contact with the free surface with air) the nonpolar group of the surfactant segregates to the surface/interface and forms a low-energy hydrophobic surface coating. In the case of contact with a polar medium, the polar groups of the surfactant will be attracted towards the interface.

The surface activity of the surfactant is at its maximum at the so-called critical micelle concentration (CMC) when a densely packed monolayer of surfactant molecules is formed on the surface of the solution. Below the CMC the surface layer is less dense, above the CMC micelles are formed in the bulk of the solution, which can be of spherical, rod-like or lamellar shape. The surface/interfacial energy of the solution typically decreases with increasing surfactant concentration, reaches a minimum at the CMC and stays constant above the CMC. For a particular solvent/surfactant combination the CMC can be affected by addition of counterions, electrolyte, etc. that tend to compensate the charge density. The CMC also depends on pH, as well as on the length of the hydrophobic group of the surfactant. Technologically surfactants have found widespread use in detergents, foams, stabilizers for emulsions, formulation of dispersions (M. R. Porter,. Handbook of Surfactants, London, Blackie Academic & Professional (1994)).

Different classes of surfactant are distinguished: Anionic (cationic) surfactants contain a nonpolar long hydrocarbon group such as $R=C_nH_{2n+1}$, and a negatively (positively) charged polar group such as a carboxylate group $RCOO^-$, sulphonate group $RSO_3^-$, sulfate group $ORSO_3^-$ or phosphate group $ROPO(OH)O^-$. Amphoteric surfactants carry both a positively and a negatively charged group. For short lengths of the nonpolar hydrocarbon group the surfactant is soluble in water, for longer chains the polymer may only be soluble in less polar solvents such as alcohols. Some anionic surfactants such as carboxylates are unstable in water solutions at low pH due to formation of the water-insoluble fatty acid.

Most cationic surfactants are based on quaternary ammonium based molecules containing a positively charged $NH_3^+$ group. An example is DD50. Cationic surfactants self-assemble preferentially on many negatively charged surfaces such as plastic surfaces, silica or glass surfaces.

Nonionic surfactants contain water-soluble groups such as alcohol or ether groups, that do not ionise, but interact favourably with water molecules due, for example, due to hydrogen bonding interaction. Examples of non-ionic surfactant are alcohol ethoxylates. Nonionic surfactant tend to have lower CMC concentrations than anionic surfactants due to their lower solubility in water. They also exhibit unusual solubility properties. The solubility decreases with temperature above the so-called cloud point. Many nonionic surfactants show strong surface activity due to reduced solubility in the bulk of the solution and good stability in acidic solutions. Alcohol ethoxylates such as $(EO)_nC_{12}H_{25}OH$ are water soluble for long EO chains (n>6), and water insoluble for short EO chains (n<4).

When the surfactant molecules segregate to the surface of the film of the first material, they form a surface encapsulation layer around the first material with a surface polarity that is opposite to that of the bulk of the first material. The surface segregation occurs already in solution or upon drying, but it may also be promoted by an additional processing step, such as an annealing step after the deposition of the first material.

For example, if the first material is a polar material, the surface energy is lowered by segregation of the surfactant molecule to the surface resulting in a repulsive surface capping layer formed by the non-polar groups of the surfactant.

In order for the repulsion of the second solution to be most efficient it is preferred that the surfactant molecule is not soluble in the solvent of the second solution. Otherwise dissolution of the surfactant capping layer around the first material will reduce the repulsive force exerted onto the second solution. Dissolution can be avoided by using different solvents for the deposition of the first and second material. It is possible, for example, to use a mixture of solvents for the deposition of the first material with a first solvent, in which the first material is soluble, but not the surfactant, and a second cosolvent for the surfactant that is miscible with the first solvent. In this case the solution of the second material would then only contain the solvent for the first material, but not the cosolvent for the surfactant.

An example of surfactants that are not water soluble, but can be dissolved in alcohols such as ethanol or isopropanol are alcohol ethoxylates with short EO segments such as 5EO-$C_{12}H_{25}$ or dioctyl sodium sulfosuccinate. Alcohols such as isopropanol are miscible with water and can be used to codeposit a water-insoluble surfactant with a solution of PEDOT-PSS.

Even if the surfactant is water soluble, the surfactant coating can be sufficiently stable on the surface of the first material in contact with a water-based solution of the second material, that on the short time scale in which the second solution is in contact with the surface of the first material before the second solution is driven back by surface energy forces, no significant dissolution occurs. For a water based solution of a conducting polymer such as PEDOT/PSS water soluble surfactants such as sodium dodecylsulfate (SDS), natural surfactants such as egg-Phosphatidylcholine (egg-PC), or fluorinated surfactants, as are commercially available from Ausimont (www.ausimont.com) under the tradename Fluorolink or Bayowet from Bayer, have been used successfully. In this case it was often observed that the water contact angle of a PEDOT/PSS surface modified by a water soluble surfactant was not stable in time. Such surfaces often showed a contact angle that was high initially, but decreased over time, presumably due to dissolution of the surfactant layer on the PEDOT/PSS surface into the water droplet on the surface. In this case more reliable repulsion of a second water-based PEDOT/PSS droplet from the first printed PEDOT/PSS pattern and successful channel definition was achieved when the second droplet was printed into the region adjacent to the first pattern, such that it only came in contact with the contact line of the first pattern upon spreading on the substrate, as opposed to being deposited partially on top of the first printed pattern. If the second droplet was printed on top of the surface of the first pattern, in many cases the second droplet did not flow off the first pattern, and after some time started to wet the first pattern. Therefore, when a surfactant is used that is soluble in the solution of the second material care needs to be taken that the printing tolerance are sufficiently small that the second droplet are not printed over the first material.

Furthermore it is preferred, that the surfactant is tightly bound to the surface. This can be achieved for example, by choosing a surfactant the head group of which has an opposite charge to that of the charged groups on the surface of the first material. Under many deposition conditions PEDOT/PSS has a negative surface charge, because of the tendency of the PSS component to segregate to the surface, increasing the density of $SO_3^-$ groups on the surface. If a cationic surfactant such as DD50 is used in such a case, tighter binding of the surfactant to the surface results than with an anionic surfactant such as SDS.

Concentrations of the surfactant in the solution are typically on the order of the CMC. At the CMC the surface activity is at its maximum, and a densely packed surface layer is formed. For much higher concentrations the surfactant forms phase separated structures, such as a micellar structure in the bulk of the material, that tend to adversely affect the morphology and electronic properties of the material. For many device applications the surfactant concentration should be at the minimum required to provide sufficient surface repulsion for the deposition of the second material, in order to minimize potential device instabilities induced by diffusion of ionic species.

In the case of PEDOT/PSS formulated in water a surfactant that is alcohol, but not water soluble can be codeposited from an alcohol cosolvent for the first deposition, while for the second deposition pure PEDOT/PSS in water can be used. The solubility of the surfactant in the solvent of the second material needs to be sufficiently low that dissolution of the surface layer is avoided on the time scale of drying of the second droplet. Dissolution of the surfactant shell may also be prevented by depositing the second material in a way such that drying is fast, i.e. by depositing from a hot solution or even from the melt using a phase-change ink, by depositing onto a heated substrate, or by providing a stream of dry gas, such as nitrogen to accelerate the drying of the second material.

The surface segregation may happen during the deposition and drying in the normal way or it may be necessary to enhance that process through evaporation rate control, temperature control or subsequent annealing. A thermal step may be needed to assist this segregation process. It may be necessary to further modify a segregated layer as with the plasma fluorination process described above.

An alternative technique to change the polarity of the surface of the first material according to this aspect of the invention is based on mixing a diblock copolymer consisting of a polar and a non-polar block with the first material. If the first material has a polar nature the non-polar block of the block copolymer tends to segregate towards the surface and form a non-polar encapsulation of the first material, that can be used to repel a solution of a second polar material. Examples of suitable block copolymers are block copolymers of polyethylene oxide (PEO) and polydimethylsiloxane (PDMS), or block copolymers of a non-polar conjugated block such as polydioctylfluorene and a polar nonconjugated block such as PEO [P. Leclere, Adv. Mat. 12, 1042 (2000)], or a block copolymer consisting of a conducting and a semiconducting block (C. Schmitt, Macromol. Rapid Communications 22, 624 (2001)). Such polymers are either soluble in water or in a polar solvent miscible with water, and can be codeposited with a conducting polymer such as PEDOT:PSS formulated in water. Other surface segregating or amphiphilic molecules such as semiconductor nanocrystals with a hydrophilic surface functionalization may also be used.

Another technique to selectively modify the surface is to codeposit with the first material a component material of different polarity that tends to phase separate with the first material. The component material is preferably one with a lower surface energy that the first material, such that is has a tendency to segregate to the surface. The desired phase separated morphology is that of vertical phase separation with the component material covering the surface on top of the first material. Techniques to induce vertical phase separation are known from research into polymer photovoltaic devices where a similar morphology is desired (for different reasons, however). Vertical phase separation can be induced by a lower solubility of the third material compared with the first material, such that it falls out of solution first when the solution is drying in from the surface. Alternatively, vertical phase separation may be induced by modifying the surface of the substrate prior to the deposition, in order to lower the interfacial energy of the first material and the substrate surface. An example of such a vertical phase separating system with which successful surface repulsion was achieved is a solution of PEDOT:PSS codeposited with polyvinylphenol (PVP) from a water/isopropanol mixture.

The vertical phase separation of the more hydrophobic PVP polymer can be enhanced by deposition from a solvent mixture, a PVP cosolvent such as isopropanol that has a lower boiling point than water. When the solution dries in from the surface, the isopropanol dries on the surface, and promotes the deposition of a PVP rich surface layer.

Yet another method to selectively modify the surface of the first region is the application of a selective surface coating layer around the first material by a post-deposition solution coating or vapour exposure step. The surface coating material could be a surfactant, a block copolymer surfactant, a self-assembled monolayer, capable of forming a covalent bond with a functional group on the surface of the first material, but not with functional groups on the surface, or any other material that selectively attaches to the first-deposited surface, but not, or at least not to the same degree, to the surface of the substrate.

An example of such a process is the dipping of a substrate containing a first PEDOT/PSS pattern in a solution containing a cationic surfactant, such as a solution of DD50 in water. Prior to the dipping the PEDOT/PSS pattern is annealed at a temperature of 150° C. in order to render the PEDOT/PSS insoluble in water. During the dip coating step the surfactant forms a surface coating on the PEDOT surface. Although we do not want to be bound by theory, the surface layer is believed to be formed by the favourable interaction between negatively charged $SO_3^{31}$ of the PSS, and the positive head group of the cationic surfactant.

Another example is a PVDF/DMA solution washed over PEDOT:PSS printed onto an conjugated polymer semiconductor substrate surface. Examples of conjugated polymer semiconductors are poly(dioctylfluorene-co-bithiophene) (F8T2) or poly(3-hexylthiophene) (P3HT). The PVDF solution dewets from the F8T2 surface onto the PEDOT:PSS areas during a spin coating, blade-coating, inkjet printing or other material's deposition step. The PVDF then serves as a patterning surface for later depositions.

According to another aspect of the invention a third material is grown off selectively from the surface of the first material. An example of such a third material is a polymer brush grown off the surface of the first material in a controlled way by functionalizing a surface with a chain polymerization initiator. This chain polymerisation can be a controlled radical polymerization such as Atom Transfer Radical Polymerization (ATRP) and the initiator would be a 2-bromo-2-methylpropionic ester derivative. Other 'living' polymerizations such as anionic, cationic, ring-opening methathesis may be used. These polymerizations allow the formation of covalently bound polymers after functionalization of the surface with a suitable initiator. In this invention, the surface of choice is the PEDOT:PSS layer. After introduction of an initiator on the surface, subsequent exposure to monomers and catalyst, in the presence or absence of solvents, leads to polymer brushes on the surface which can be up to several hundreds of nanometers thick.

Their hydrophobic nature provides a chemically and mechanically robust hydrophobic layer to repel subsequent drops.

In another embodiment of this embodiment of invention a surface coating layer is grown by electroless plating after the deposition of the first printed pattern. In a first post-deposition step a catalysing surface initiator is deposited selectively onto the surface of the first material. This surface initiator then catalyses a surface reaction when the substrate is dipped into a bath containing a precursor of the third material (Z. J. Yu, Journal of the Electrochemical Society 149, C10 (2002)).

According to another implementation of the invention the surface coating layer is grown off the surface of the first material by an electrochemical process. In this case the first material must be an electrically conducting or semiconducting material to which an electrical contact is made after the deposition. The whole structure is then placed in a solution containing a precursor of the surface coating material, and an oxidation or reduction reaction occurs on the surface of the first material when a voltage is applied to the pattern of the first material with respect to a counter electrode in the solution. After further processing, perhaps involving drying or curing, the second deposited material may be applied to the substrate where the usual repulsion is seen forming a small, highly reproducible gap.

Although we do not want to be bound by theory, the width of the gap between the first and second material, that is formed when the second material is repelled from the surface of the first material, is believed to be determined by the drying mode of the solution of the second material on the substrate. If the contact line of the solution of the second droplet is not pinned during drying on the substrate, the contact line of the second solution will move away from the boundary of the first region upon drying, and gaps with a length of several micrometers can be achieved (FIG. 1(*c*)). In the other limiting case, where the contact line becomes pinned as soon as it comes in contact with the boundary of the first region, the gap width is defined by the width of the surface layer on the first material, and can be of molecular dimension (FIG. 1(*d*)).

The drying mode of the second solution that determines the gap between the first and second region can be affected by various factors, including, but not limited to the surface polarity of the substrate, the surface roughness of the substrate (a rough surface tends to pin the contact line), the temperature, the gas atmosphere above the substrate, the presence of external electric, magnetic or gravitational fields, as well as the surface tension, viscosity, and boiling point of the solvent or mixture of solvents of the second solution.

According to another embodiment of the present invention there is provided a method by which the surface of the substrate surrounding the first pattern is modified during the drying process of the solution of the first material as to form a surface energy barrier for the deposition of the second material that is self-aligned around the edge of the first pattern. Several methods are disclosed here that enable the formation of such a self-aligned surface energy barrier surrounding the first pattern.

When a liquid droplet spreads on the surface of a wetting substrate, a so called precursor film is formed around the droplet (see for example, Souheng Wu, Polymer Interface and Adhesion, Marcel Dekker Inc., New York (1982)). The precursor film is much thinner than the typical thickness of the bulk droplet and extends beyond the macroscopic contact line of the bulk liquid droplet. In some cases the precursor film is subdivided into a somewhat thicker secondary film and a thin primary film.

Figure 3:
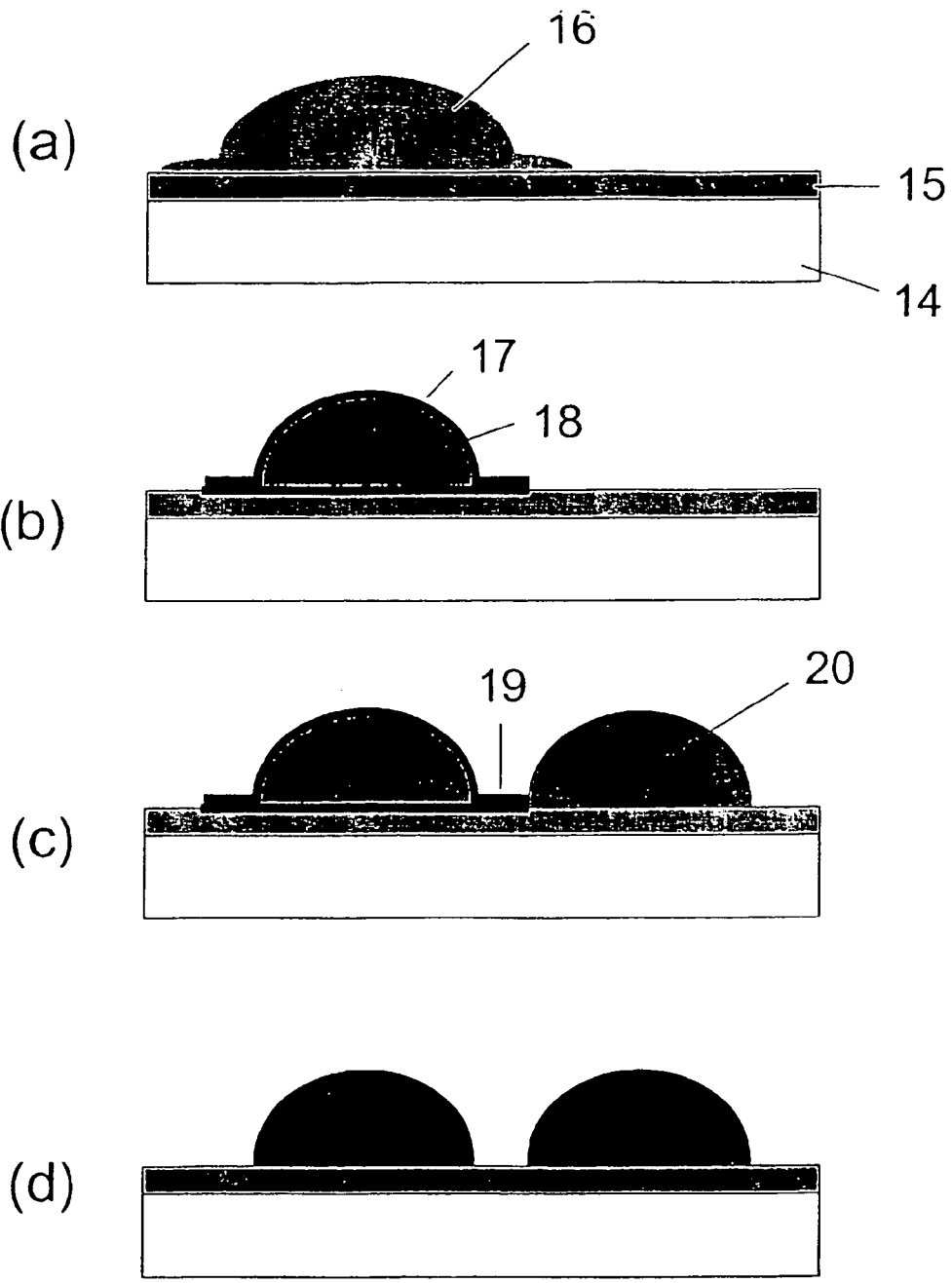
FIG. 3 shows the repulsion of the second solution from a surface region surrounding the first printed pattern.

Upon drying of the first droplet 16 this results in a very thin film of material around the edges of the bulk droplets that can be used to selectively modify the surface energy in a well-defined region around each droplet (FIG. 3). The surface of the dried precursor film 19 can be modified selectively by plasma treatment, surfactants mixed in the solution of the first material, or other techniques in the same way as described above. This can then be used to repel a solution of the second material. This method is different from the one described above in the sense that the width of the precursor layer, and therefore of the gap that is formed between the first material 18 and the second material 20, can be controlled by the wetting conditions on the substrate. The more wetting the substrate is for the solution of the first material, and the lower its surface energy the wider is the precursor film around the droplet. This method generally does not allow formation of gaps with molecular dimensions, but it allows formation of gaps with micrometer size. For many applications it is not important that the critical features are of submicrometer dimensions, it is rather more important that the gaps are formed with a very high yield. A high yield is more likely to be achieved if the separation between the first and second region is on the order of micrometers.

Although the precursor film is very thin, in some cases it might be desirable to further reduce its thickness or even remove it after the printing of the second material in order, for example, to reduce the conductance between the first conductive and the second conductive region. This can be achieved by exposing the completed structure after the deposition of the second material to a physical etching process such as a plasma etching step. By adjusting the etching time this process removes the very thin dried precursor film in between the first and second region, without significantly thinning the much thicker bulk regions (FIG. 2(*d*)).

Figure 4:
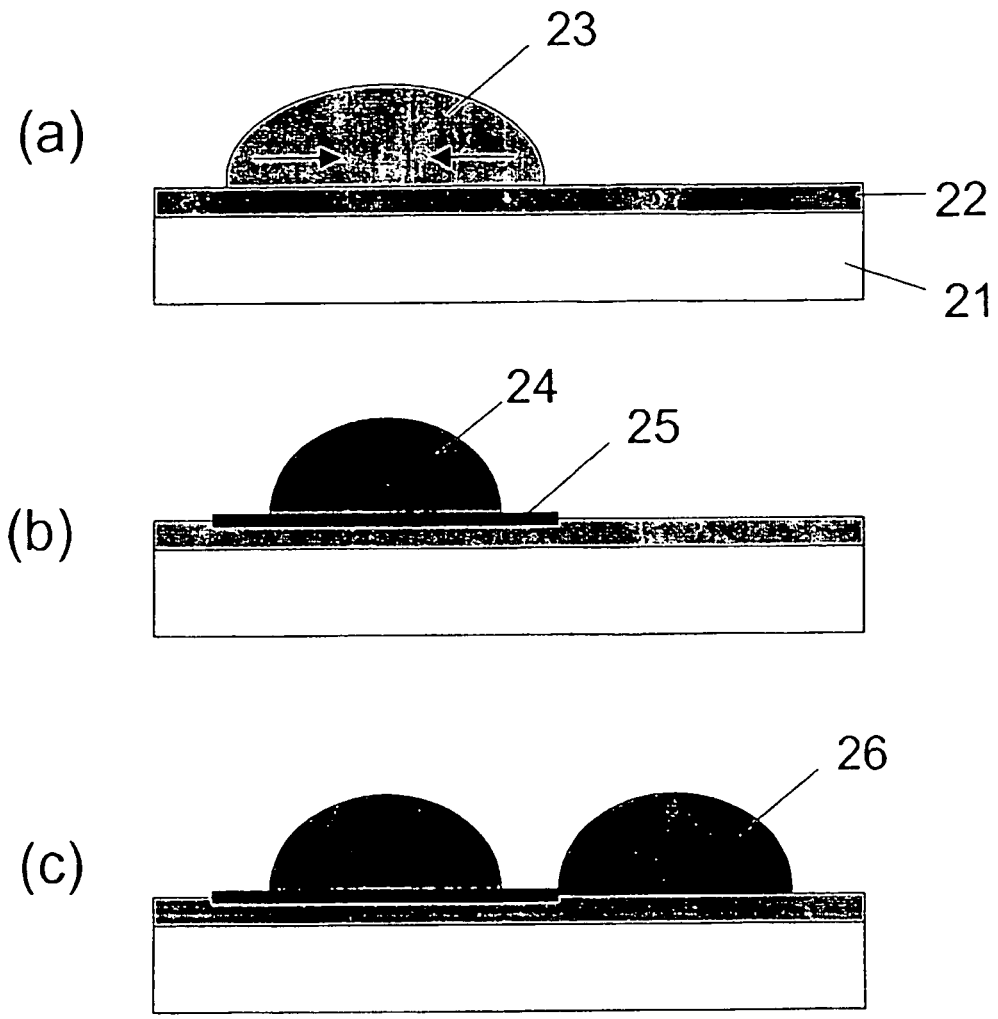
FIG. 4 shows the self-aligned modification of the area surrounding a first droplet by deposition of a surface modifying agent during drying of the solution of the first material.
Figure 5:
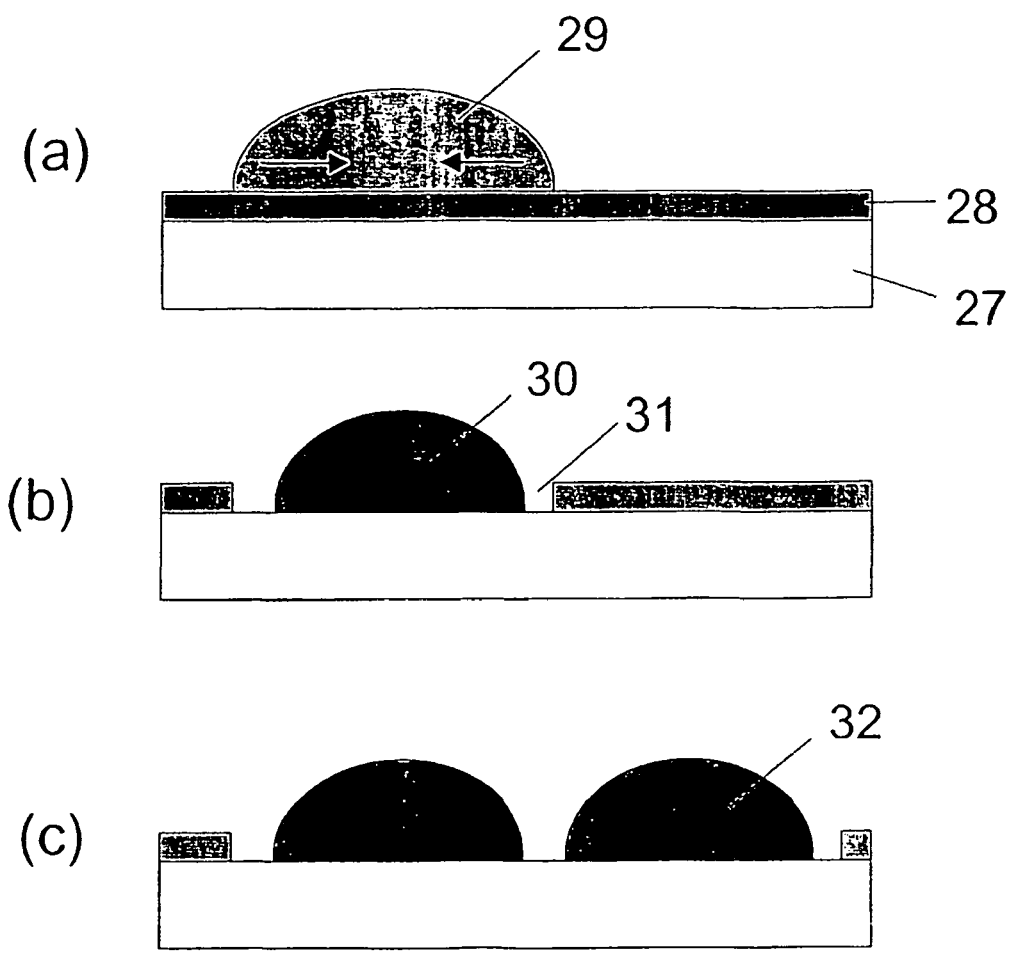
FIG. 5 shows the self-aligned modification of the area around a first droplet by dissolution of a thin surface layer during drying.

Another possibility to define a region of modified surface energy around a first printed droplet is to make use of the drying mode of the first droplet (FIG. 4). If the contact line of the first droplet is not pinned on the substrate initially, i.e. after impinging onto the substrate, the diameter of the first droplet 23 shrinks during drying, before it becomes pinned finally when the viscosity in the drying droplet becomes so high that the contact line cannot move any further. If a surface modifying agent that has a high affinity for bonding or adhering to the substrate is mixed into the solution, the surface modifying agent attaches to the bare substrate surface when the droplet recedes, and modifies the surface energy in the region around the first droplet 25 extending from the initial to the final position of the droplet contact line. This region of modified surface energy can subsequently be used to repel a second printed droplet 26 and define a self-aligned gap between the two printed regions with a width that is only dependent on the drying mode of the first droplet. Examples of such surface modifying agents are surfactants that are capable of attaching themselves to functional groups on the surface of the substrate. In the case of a polar substrate surface with negatively charged surface groups, such as the OH$^-$ groups on the surface of a glass or $SiO_2$ substrate, a cationic surfactant such as DD50 is used. In the case of a polar substrate surface with positively charged surface groups, such as a glass substrate modified with a self-assembled monolayer containing a $NH_3^+$ group, an anionic surfactant such as SDS is used. Another example of a surface modifying agent that is capable of bonding to a hydrophilic surface terminated, for example, by COOH groups and to make the surface hydrophobic are alkylamine derivatives $CH_3(CH_2)_{n-1}NH_2$ [S. W. Lee et al., J. Am. Chem. Soc. 122, 5395 (2000)]. When mixed into a solution of the first material (that may also contain a cosolvent to facilitate the dissolution of the surface modifying agent in the solution), the alkylamine derivatives deposit in the surface region from which the droplets of the solution recede resulting in formation of a narrow hydrophobic surface region around the final edge of the dried material.

Figure 6:
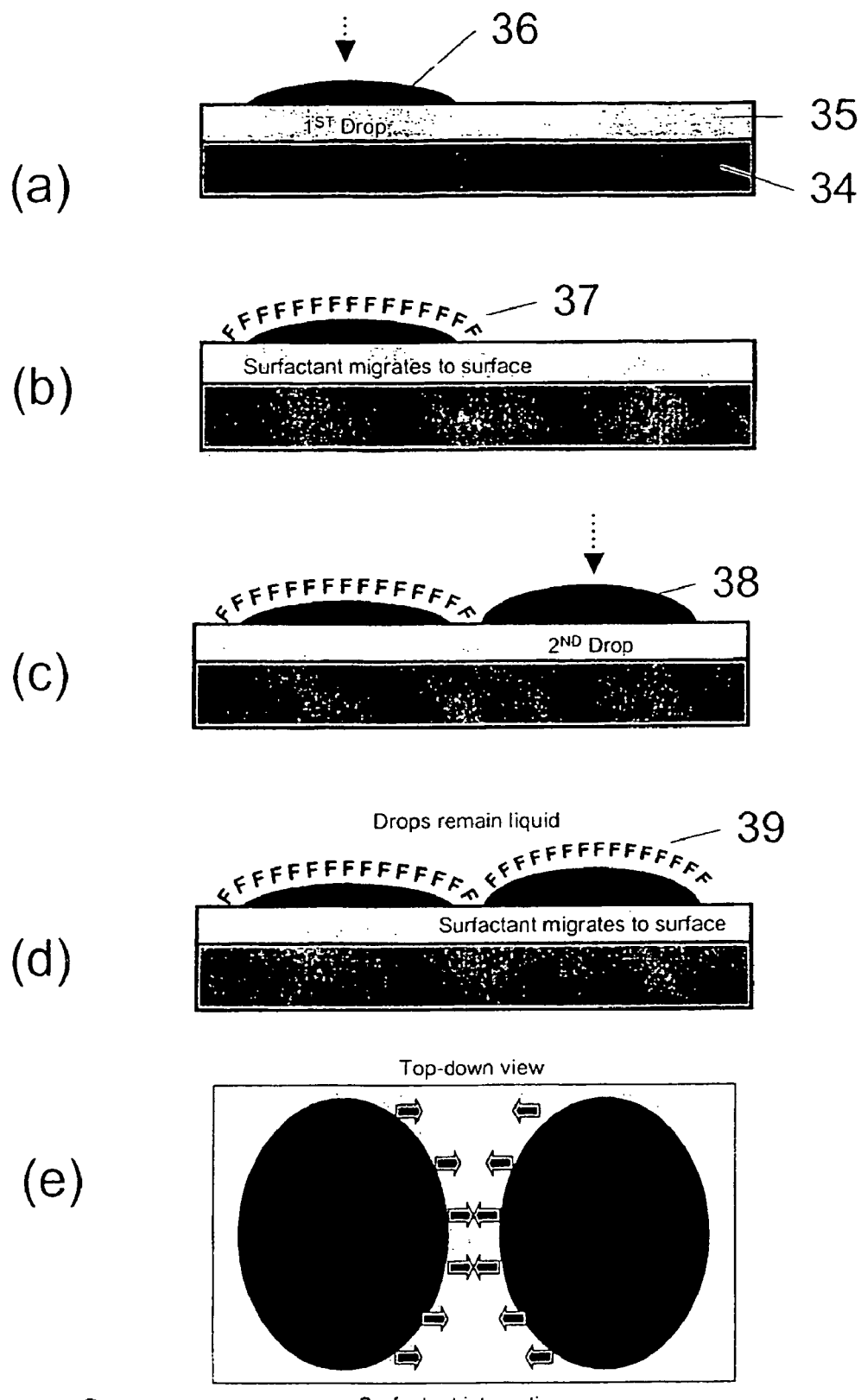
FIG. 6 shows the repulsion of the second solution from the selectively fluorinated region of the first material while both droplets are still liquid.
Figure 7:
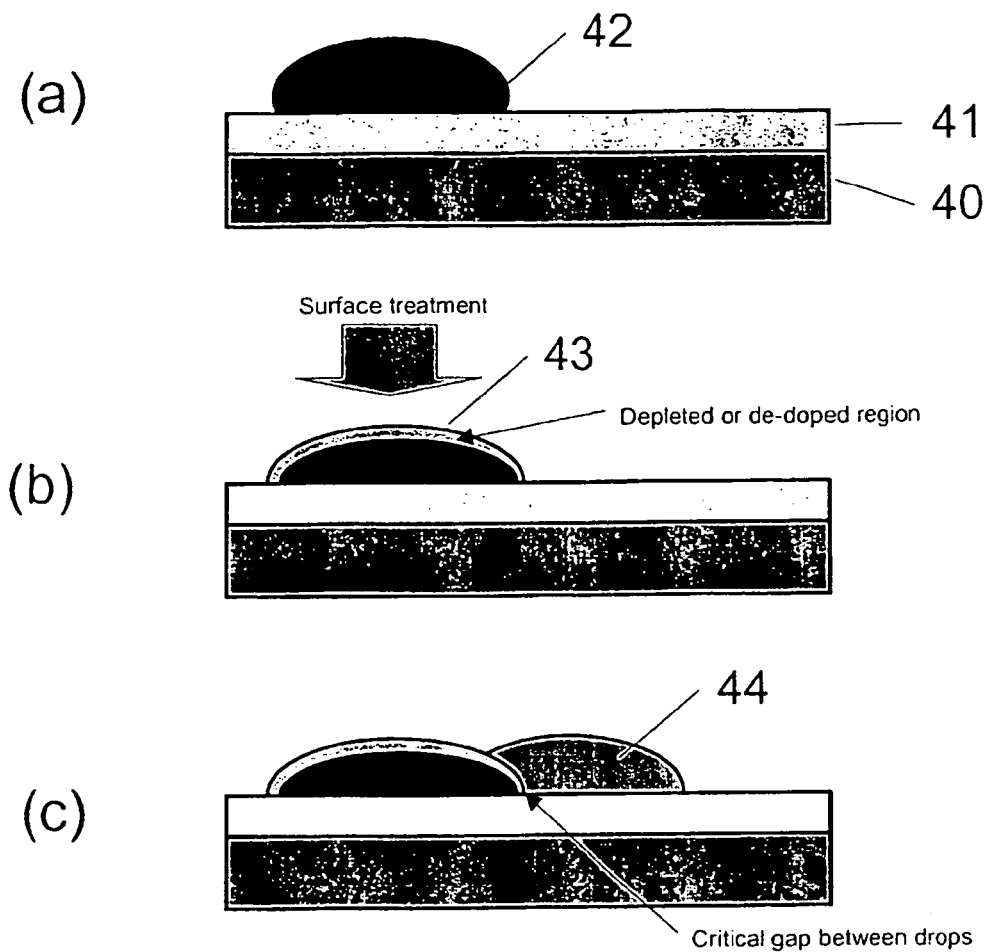
FIG. 7 shows the modification of the surface of a first conducting material by dedoping of the surface layer.

It is also possible of course that after the self-aligned deposition of the surface modifying agent around the first droplet a selective chemical reaction is performed in which another surface modifying agent reacts selectively on the modified surface regions to further enhance the surface energy contrast.

A related method for defining a self-aligned surface energy pattern around the first region is to subject the substrate to a thermal annealing step after deposition of the first material. If the thermal expansion coefficient of the substrate is larger than that of the first material the first droplet will shrink on the substrate. If the solution of the first material contains an agent that selectively segregates towards the interface of the first material and the substrate and modifies the interfacial energy forming an interfacial layer 25, the shrinking first region will leave behind an exposed region of the substrate with a surface energy that has been modified by having been in contact with the substrate. An example of such agent would be a non-polar molecule or polymer in a polar solution of the first material in contact with a non-polar substrate.

Another method is based on a modification by the surface topography by the receding first solution. If, for example, between its initial contact line and the final position of the contact line the solvent interacts with the substrate in such a way that it increases the surface roughness, for example by swelling of the substrate or by selectively dissolving a component of the surface layer of the substrate, the resulting region of increased roughness around the first droplet can be used to pin the contact line of the second droplet when the latter is attempting to spread into the region of increased roughness. Contact line pinning is known to be enhanced by surface roughness. This effect can be used to prevent the solution of the second material coming in contact with the region of the first material.

Yet another method of defining a self-aligned region of modified surface energy around the first droplet is to mix the solution of the first droplet with an agent that is able to diffuse out of the region of the first material, and modify the surface energy of a small region on the substrate around the first region. The surface diffusion of the mobile agent might be enhanced by annealing the substrate to elevated temperatures. The width of the surface modified region in this case is controlled by the time and temperature at which the surface diffusion is performed.

Yet another way of defining such self-aligned surface energy pattern around the first region is disclosed in FIG. 5. In this case the substrate 27 has a hydrophobic surface that is coated with a thin film of a polar material 28 that is soluble in the solvent used for the deposition of the first droplet. When the first droplet recedes on the substrate from its initial diameter it locally dissolves the polar film around its edges, and uncovers the surface of the buried hydrophobic substrate in a region 31 that is self-aligned with the edge of the first material. If a solution of the second material 32 is deposited into a surface region adjacent to the region of the first material, the solution of the second material is repelled when it is coming in contact with the hydrophobic region surrounding the edge of the first material. The solubility of the polar material 28 in the solvent of the first material needs to be sufficiently low as to promote initial spreading of the droplet, followed by a contraction of the droplets once layer 28 has dissolved into the solution of the first material.

The drying mode and surface energy barrier width can be controlled by the surface energy of the substrate surface, i.e., the contact angle, the surface and interface tension of the liquid solution on the substrate, the temperature of the substrate that affects the drying time of the first droplet, the gas atmosphere above the substrate, the presence of electrical, magnetic, or gravitational fields, etc.

Yet another way to modify the surface conditions of a first conducting material 42 is to dedope the surface layer or to deplete it off charge carriers (FIG. 7). In the case of a conducting polymer dedoping of the surface layer results in a non-conducting surface layer 43 with modified surface energy and solubility properties. The dedoping might, for example, be performed by electrochemical dedoping. The second deposited material 44 is then placed adjacent or on top of the first layer wherein the gap is defined by the thickness of the depleted or de-doped layer.

In one embodiment of the invention both the first material and the second material are dissimilar materials, including but not exclusively, conducting polymers, which are deposited on the substrate via, for instance, solution processing techniques.

In another embodiment of the invention both the confining layer and material of interest are similar, or indeed identical materials, including but not exclusively conductive polymeric materials.

In some cases, such as that of an insulator segregating to the surface of the first drop, it may be necessary to remove the surface coating layer after deposition of the second material. In some TFT device architectures where the conducting channel would be deposited in contact with the printed self-aligned source and drain electrodes charge carrier injection might be impeded by the presence of insulation surface coating layers. The selective removal may be achieved by a washing step, by a physical etching step or other controlled material removal techniques. In a bottom gate TFT structure (FIG. 8*b* to d), or a structure as in FIG. 12 with the channel materials underneath the channel material, this may not be necessary.

In all cases the formation of the self-aligned gap between two printed patterns can be used for arbitrary shapes of the printed patterns, i.e. to define a gap between two single printed droplets, or to define a gap between a first pattern of linear dimension, for example in the form of an interdigitated array with increased area of contact.

In one embodiment of the invention a first material is deposited onto a surface and then surface modified. A second material is then deposited so that there is a selective repulsion between the first material and the second. The first layer is then removed by selective solvent dissolution or some other technique so that the surface exposed is modified for further treatment (with an adjacent, well defined layer of second material).

In one embodiment of the invention external directing or confining effects such as electric field, gravitic influences or indeed a manipulating probe are used to physically move, or hold, a deposited material, whilst still in liquid form, into an advantageous conformation.

The deposited materials may be placed simultaneously and adjacent onto the surface where repulsion occurs due to the nature of the differences in solvent. The basic premise is that two immiscible solvents are used that, under normal circumstances repel each other (polar and non-polar for instance). It is envisaged that the deposited materials are dissimilar or similar in chemical composition. A further modification of this technique is to use a surface modifying additive, or groups, to both deposited materials. These materials may be aqueous or solvent based in nature, and may be of similar or dissimilar materials. These surface active agents or groups, when deposited simultaneously, or separately (but not drying) AND adjacent to each other, interact and repel either due to steric hindrance or electrical repulsion (FIG. 6).

The processes as disclosed here can be used for the controlled fabrication of a range of electronic devices.

Figure 8:
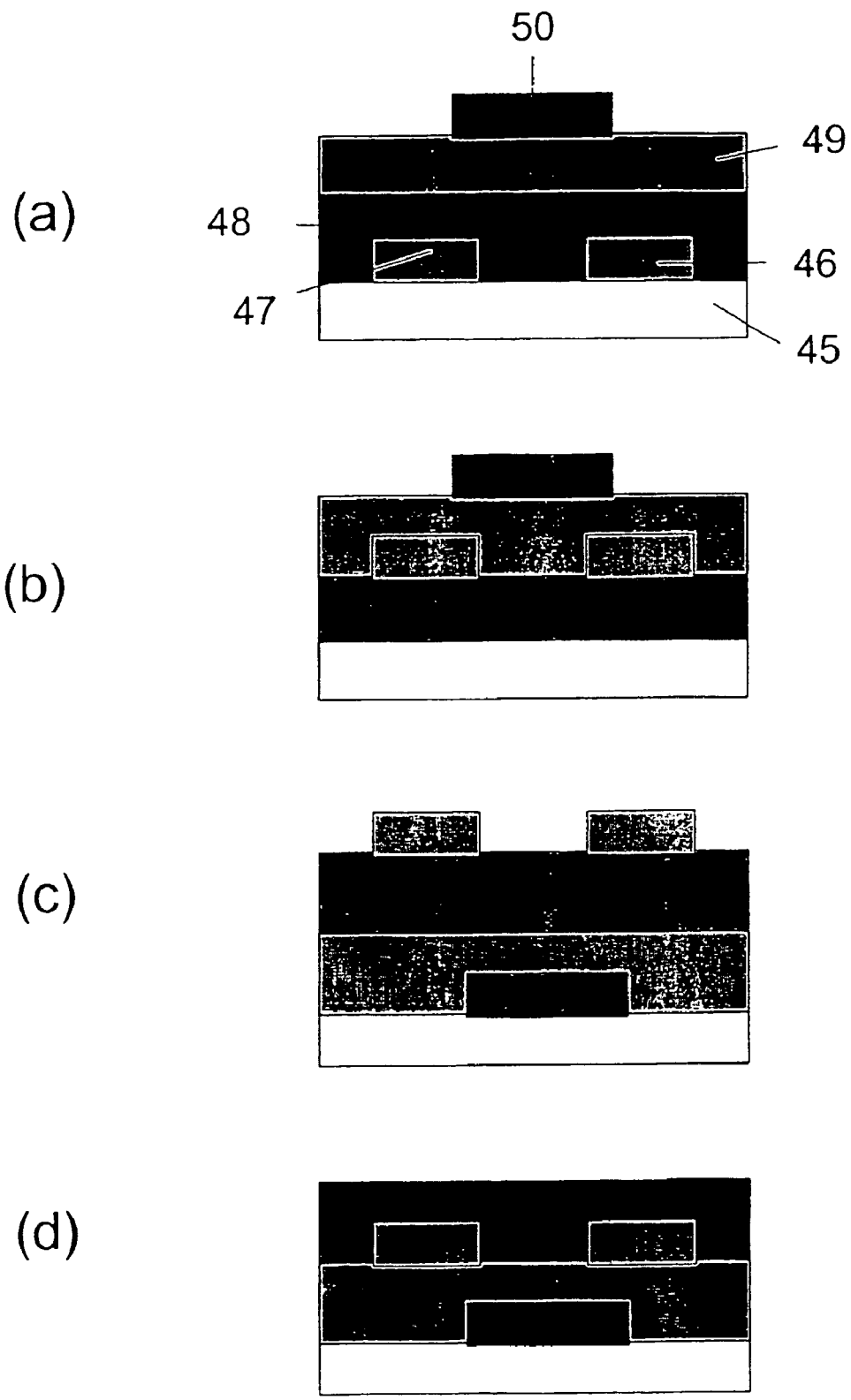
FIG. 8 shows different device configurations for TFTs with self-aligned source-drain electrodes.

If the first and second material are conducting materials they can be used as source and drain electrodes of a thin-film transistor with the self-aligned gap between the two regions forming the channel of the TFT. Several TFT configurations are possible, such as top gate TFTs with the source and drain electrodes printed on top of the substrate (FIG. 8(a)) or directly on top of the semiconducting layer (FIG. 8(b)) as well as bottom gate TFTs in which the source and drain electrodes can also be on either side of the semiconducting layer (FIGS. 8(c) and 8(d)). It should be noted that configurations (b) and (d) are advantageous because they allow efficient charge injection from the source-drain electrodes directly into the TFT accumulation channel.

Figure 9:
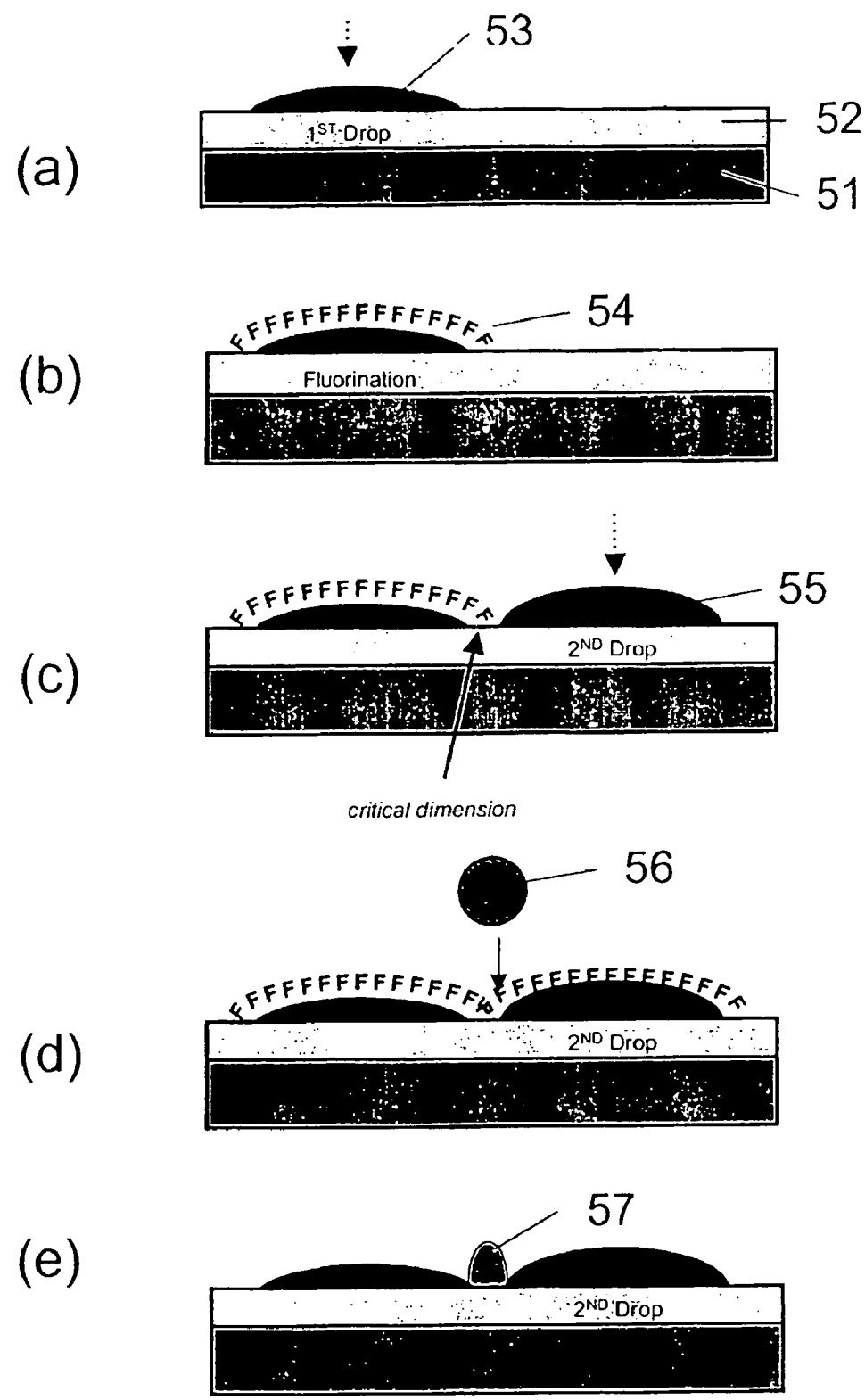
FIG. 9 shows the definition of a self-aligned narrow line that is confined on two sides.

Using the above techniques it is also possible to fabricate narrow features that are confined on both sides (FIG. 9). In a first step a narrow, well defined gap is formed between a first region 53 and a second region 55. By using techniques such as $CF_4$ plasma treatment, as described above, the surfaces of the first and second material are prepared in a low energy state. A third material 56 can subsequently be printed into the gap region and can be confined to the gap region by action of a repulsive surface interaction with the first and second region. If the third material is a conducting material such as PEDOT/PSS narrow conducting lines 57 can be printed, with a width that is reduced significantly compared with the width of an confined conducting line.

An example of such a structure are first and second regions of an insulating non-polar polymer such as surface modified PVP or polyimide on a polar substrate such as glass or a substrate with a top layer of polyvinylalcohol. Such a structure is able to confine droplets of a water-based, conducting polymer solution of PEDOT:PSS, and allows definition of a narrow conducting line. Such lines can be used, for example, as interconnects in electronic circuits, or as gate electrodes in TFT devices with reduced overlap capacitance between source/drain and gate electrodes. Even if the third material is not fully confined to the gap region the increasing thickness of insulator away from the middle of the doubly confined line would also serve to further reduce overlap capacitances with underlying electrodes (FIG. 9).

Figure 10:
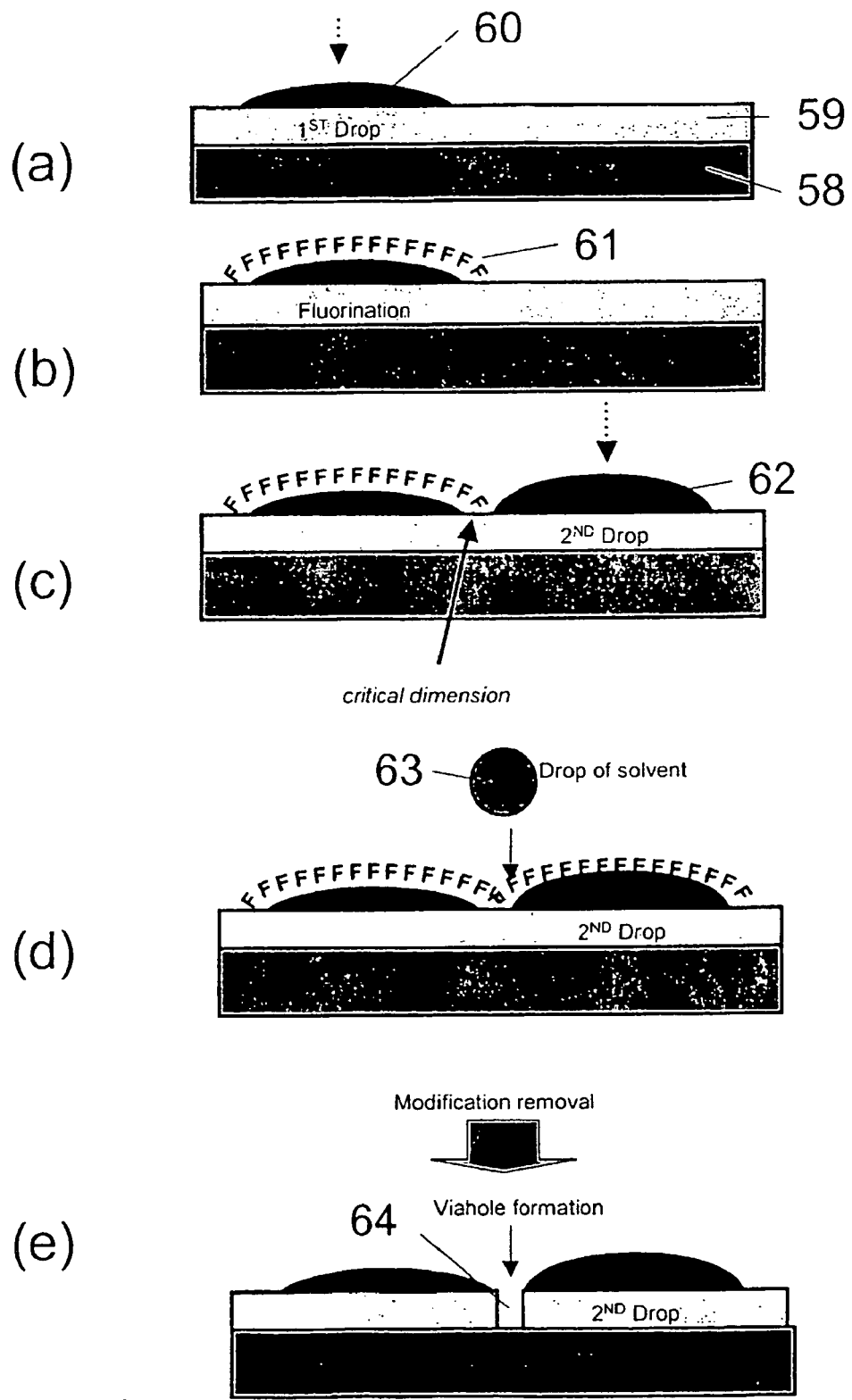
FIG. 10 shows the self-aligned formation of a via-hole interconnection with a small diameter.

Another useful application of our process is the high-resolution definition of via-hole interconnects. In UK 9930217.6 a method for via-hole formation is described that is based on the local dissolution of a layer structure by local inkjet deposition of solvents. In order to define via-holes with dimensions smaller than the solvent droplet diameter it is necessary to confine the solvent droplets on the surface of the substrate. This can be achieved in the following way. In a similar way as described in the previous section a self-aligned confinement structure 60,62 can be defined on the surface of a substrate that contains buried electrodes 58 to which electrical connections are to be established. The buried electrode is covered by a dielectric layer 59, through which a via-hole connection needs to be opened. An example of such a structure are nonpolar confinement structures of surface modified PVP or polyimide, on a layer of PVA with underlying electrodes of PEDOT:PSS. If a good solvent 63 for the dielectric layer is deposited onto such a structure, the solvent is only able to dissolve the dielectric layer inside the gap formed between the two nonpolar regions, as long as the nonpolar polymer is not soluble in isopropanol. As a result a via-hole is formed with a dimension that is defined by the size of the gap between the two nonpolar self-aligned confinement regions (FIG. 10).

The process described above is also useful for defining other components of self-aligned electronic devices other than electrodes, such as the active semiconducting layer itself or the gate dielectric layer.

Figure 11:
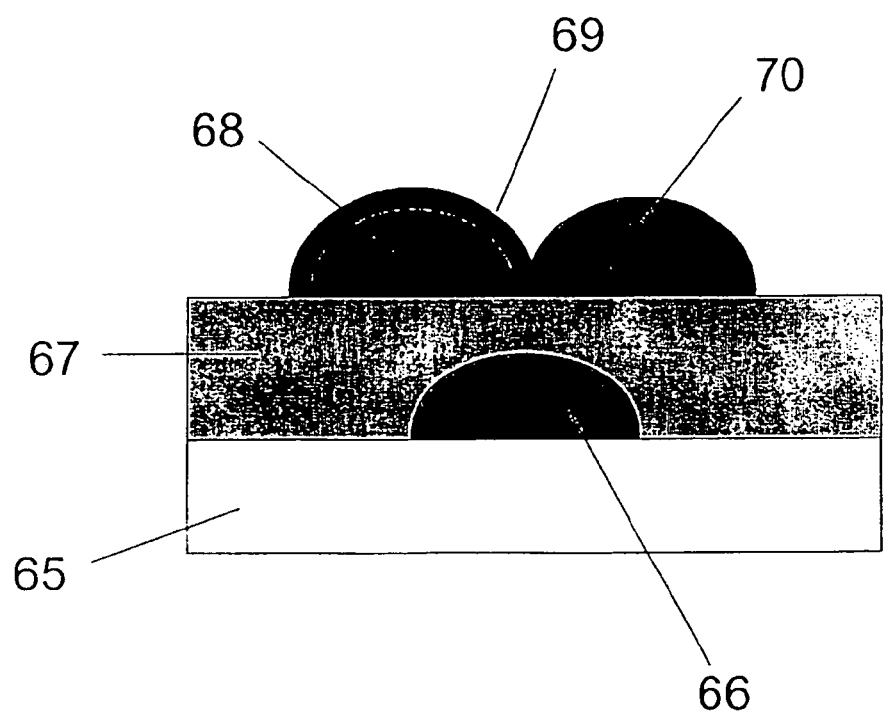
FIG. 11 shows the structure of a self-aligned TFT in which the surface capping layer serves both to define the channel length as well as to act as the semiconducting layer of the device.

FIG. 11 shows a schematic cross section of a self-aligned transistor device according to the present invention with a bottom gate 66, a gate dielectric 67, self-aligned source-drain electrodes 68 and 70. In this device the surface modification layer 69 used for the self-aligned printing is a semiconducting material that also forms the active semiconducting layer of the device. In this case it is important that the drying mode of the second droplet results in intimate contact between the first and second electrode. Semiconducting surface modification layers 69 can be grown for example by techniques that allow the growth of polymer brushes off surfaces, such as controlled radical polymerization.

Figure 12:
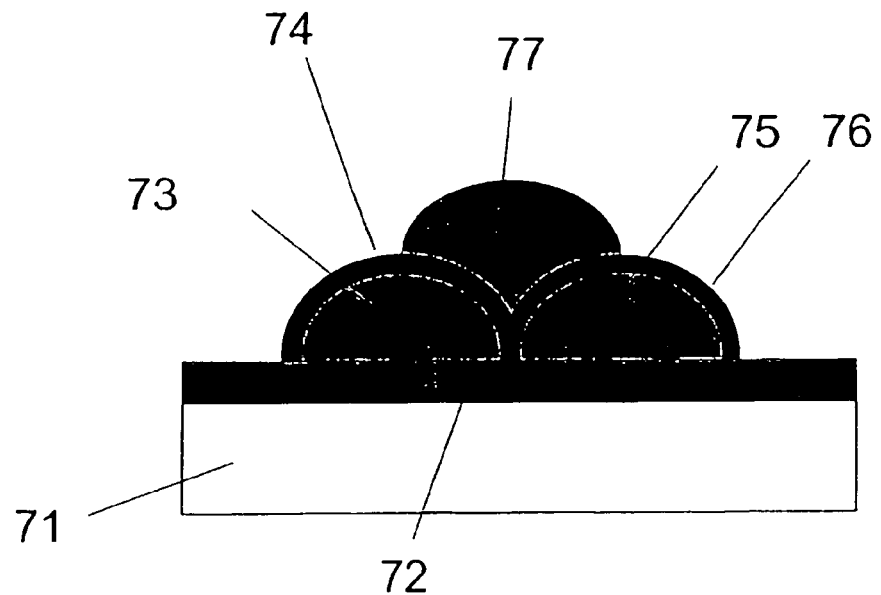
FIG. 12 shows the structure of a self-aligned TFT in which the surface capping layer serves both to define the channel length as well as to act as the dielectric layer of the device.

FIG. 12 shows a schematic cross section of a self-aligned transistor device according to the present invention with semiconducting layer 72, self-aligned source-drain electrodes 73 and 75, and gate electrode 77. In this device the surface modification layers 74 and 76 used for the self-aligned printing is a dielectric material that also forms the gate dielectric layer of the device. Also in this case it is important that the drying mode of the second droplet results in intimate contact between the first and second electrode. Semiconducting surface modification layers 74 and 76 can be grown for example by techniques that allow the growth of polymer brushes off surfaces, such as controlled radical polymerization, such as surface-initiated polymerization of PMMA.

The invention will now be described by way of the following examples.

EXAMPLE 1

$CF_4$ Surface Treatment

Figure 2:
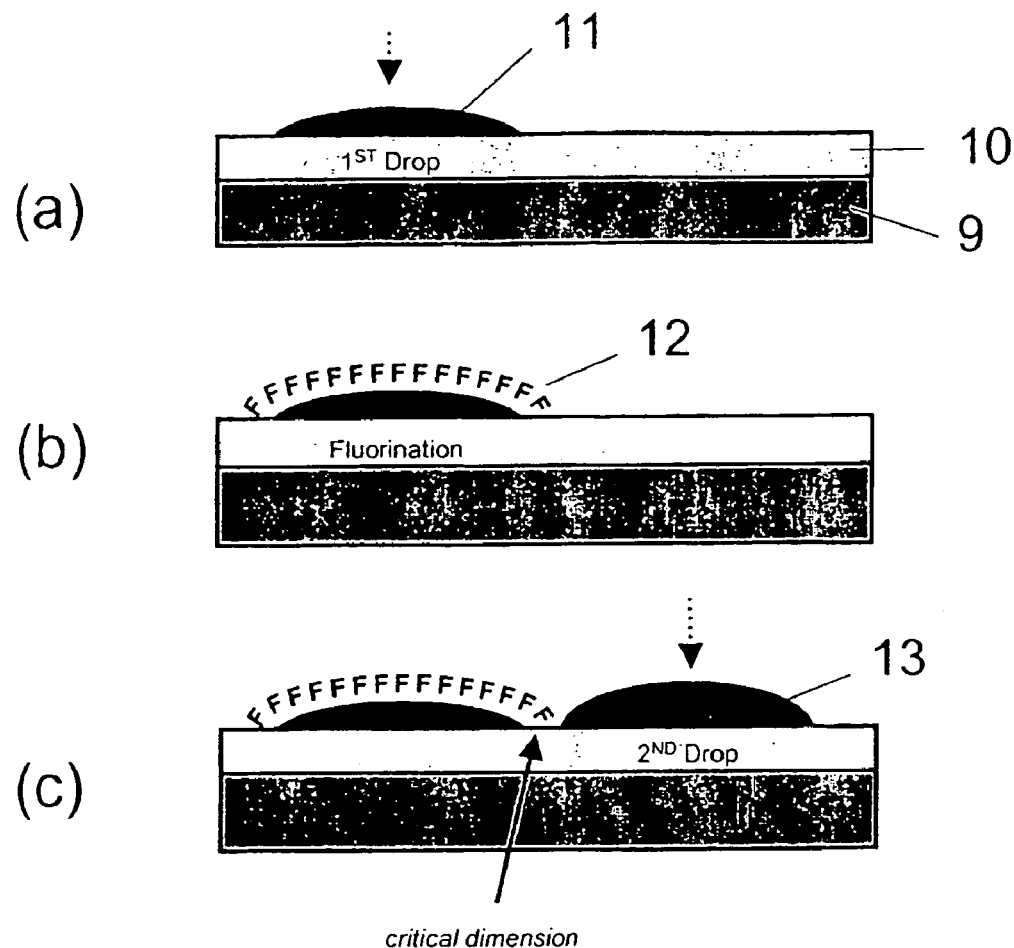
FIG. 2 shows the repulsion of the second solution from the region of the first material with a selectively fluorinated surface achieved by exposure to a $CF_4$ plasma.

An example of a vapor phase process to form a self-aligned source-drain TFT, assisted by an RF plasma, is shown in FIG. 2. In this example, a $CF_4$ plasma selectively modifies a first-deposited PEDOT:PSS layer relative to its glass substrate. The substrate in this case is a glass substrate or a conjugated polymer semiconductor thin film, such as F8T2 on top of a glass substrate. The surface modification primarily serves the purpose of repelling a subsequent deposition of material. However, it may also serve the purpose of electrically or otherwise deactivating the near surface or edge area of the first-deposited material or altering the solubility of the near surface or edge area of the film. This may serve the purpose of electrically isolating or expanding the gap between the first and subsequently deposited materials.

The next step includes the printing or otherwise depositing the second material on or adjacent to the first printing. Due to the repelling nature of the first surface, the second-printed material is pinned to the edges defined by the first drop. In the case of the fluorinated PEDOT:PSS, this then leads to an extremely small gap between the two PEDOT:PSS regions.

A clean substrate, in this example glass, is prepared using solvent washing and oxygen plasma etching. The substrate is mounted beneath an inkjet head and a liquid conductive polymer, PEDOT/PSS (BAYTRON P, Bayer) is introduced to a drop on demand inkjet head (DOD) and is deposited such that subsequent drops are touching and form a continuous line pattern. Other solution printing techniques are envisaged for example continuous inkjet, flexographic and gravure lithography, screen printing and pad stamping. The drops, at this stage are unconfined, with the spread determined by the substrate and drying under normal evaporative conditions. Furthermore the drying process may be aided, but not exclusively required by, using hot air drying, ultrasonic drying or other forcing conditions. The printed material is then surface modified, by the use of $CF_4$ plasma etching at a power of 50 to 250 W for 30 s to 10 min. The $CF_4$ plasma renders the surface of the PEDOT/PSS pattern on the substrate hydrophobic, while the surface of the glass substrate remains essentially hydrophilic. The substrate is then remounted beneath the printhead and a second PEDOT/PSS pattern is deposited close to the first, surface modified PEDOT/PSS. The jetted droplets spread towards BUT are repelled by the hydrophobic surface of the first PEDOT/PSS pattern. If the droplets of the second pattern of PEDOT/PSS are deposited on top of or partially on top of the first PEDOT/PSS pattern, we observed that the droplets of the second pattern are repelled, and flow off the surface of the first pattern, and dry in such a way that the contact line of the second PEDOT/PSS pattern is in close proximity of the contact line of the first PEDOT/PSS pattern. The second droplet conforms to the edge of the first PEDOT/PSS pattern.

In this fashion it is possible to attain very small gaps between the first and second printed PEDOT patterns. The gap width depends on the drying mode of the PEDOT droplets on the substrate after they have flown off the first PEDOT pattern. On a hydrophilic glass substrate gaps down to less than 100 nm have been measured by atomic force microscopy. Measurements of the electrical conductivity between the first and second PEDOT pattern show that the gap between the two patterns is nevertheless well defined, and no electrical shorts are present between the two patterns.

EXAMPLE 2

Surfactant Modified Inks

For the inkjet deposition of the first PEDOT electrode pattern different surfactant molecules were mixed into a PEDOT:PSS ink, that consisted of a 1:1 mixture with water of PEDOT Baytron PH as available commercially from Bayer with various concentrations of surfactant. Cationic (DD50), anionic (SDS, Fluorolink), and non-ionic surfactants (alkylethoxylated surfactants of the form $EO_m C_n H_{2n} OH$ were used with concentrations varying between 1 mg of surfactant/ml PEDOT/PSS stock solution and <0.1 mg of surfactant/ml PEDOT/PSS stock solution. In the case of DD50 and the ethoxylated surfactant the ink consisted of a mixture of the PEDOT/PSS stock solution in water and a solution of surfactant in isopropanol, as both DD50 and the ethoxylated surfactant with alkyl chains longer than n=5 are not water soluble.

The surfactant modified inks were inkjet deposited onto a range of different substrates with different surface polarities. 7059 glass substrates were used that were made wetting by $O_2$ plasma treatment (250 W for 10 min) which produces a large number of negatively charged $OH^-$ functional groups on the surface. Hydrophilic glass substrates were also modified with a quaternized amine self-assembled monolayer to produce a polar surface terminated by positive $NMe_3^+$ surface groups (P. K. Ho, Adv. Mat. 10, 770 (1998)). Glass substrates were also coated with layers of PVP and PMMA polymer. The polymer surfaces were prepared in a hydrophilic wetting state by a short, low power $O_2$ plasma etching step (100 W, for 30 s). In the case of PMMA this step is necessary, because the surface is too hydrophobic to allow inkjet printing of continuous patterns of PEDOT. In all cases surfactant modified PEDOT droplets had a larger radius on the substrate after drying than pure PEDOT droplets due to the lowering of the surface energy induced by the surfactant. This is evidence for the segregation of the surfactant to the surface during the drying process.

After the deposition of the first electrode pattern glass substrates were annealed at a temperature of 100-150° C. to remove residual water from the PEDOT, and to further promote the segregation of the surfactant. In a second set of experiments the substrate was not annealed prior to deposition of the first PEDOT electrode.

For the second PEDOT electrode we used both unmodified PEDOT/PSS stock solution as well as the same surfactant containing ink that was used for the deposition of the first PEDOT pattern. No difference was observed with respect to the ability of the first droplet to repel the ink of the second droplet.

In the case of the ink for the second and first electrode being identical the second electrode pattern was printed immediately after the first pattern, in some cases even while the first electrode was still partially liquid. Even in this case repulsion between the two droplets was observed.

Figure 14:
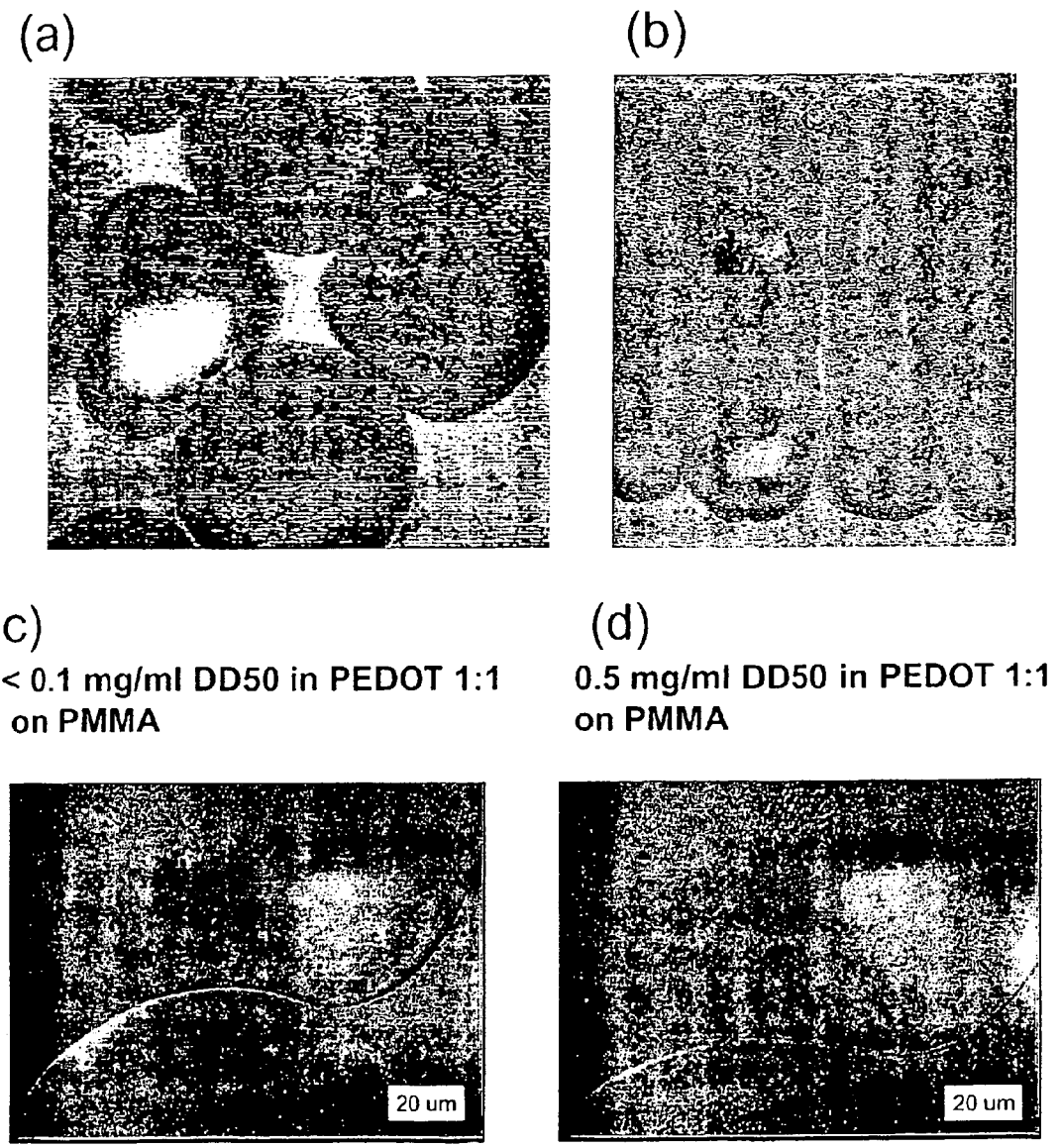
FIG. 14 shows optical micrographs of dried droplets of PEDOT/PSS printed by the self-aligned printing method.

With some surfactants, such as water soluble SDS, the yield for non-shorted source-drain electrodes was higher when the ink of the second droplet was not printed directly on top of the first droplet, but only came in contact with the edge of the first electrode during the spreading motion of the second droplet on the substrate. This is believed to be due to partial dissolution of the surfactant coating when the water based ink of the second droplets comes in contact with the surfactant shell. We can define a printing distance s as the smallest difference between the edge of the first droplet, and the centre of the second droplet when it impacts on the surface of the substrate. If the second droplet has a diameter $d_1$ in the air prior to impact with the substrate, and a maximum diameter $d_2$ during the spreading motion in a homogeneous region of the substrate, the printing distance s had to be in the range $d_1/2 + \alpha < s < d_2/2$. $\Delta$ is a safety distance, the larger $\Delta$ the smaller the kinetic energy with which the contact line of the second droplet impinges onto the boundary of the first droplet. Reliable printing was observed with $\Delta \geq 20$ μm, even in cases where the ink of the second droplet did not flow of the first PEDOT pattern. FIG. 14 shows optical micrographs of self-aligned first and second droplets on a glass substrate (a) & (b) and on a PMMA substrate (c) & (d). The first droplets are round, while the second droplets are distorted and conform to the round shape of the first droplets.

Figure 15:
FIG. 15 shows atomic force topographic cross-sections and micrographs of self-aligned PEDOT/PSS droplets deposited with different concentrations of the cationic surfactant Di-n-decyl dimethylammonium chloride (DD50).
Figure 15:
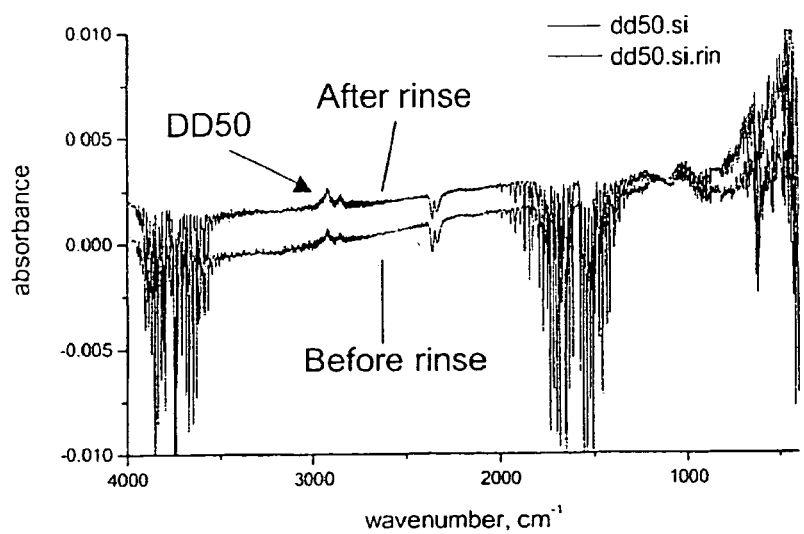

It was observed that the polarity of the surface had a significant influence on the reliability of the self-aligned printing in terms of the number of devices with shorts between source and drain. On a plasma treated glass surface with a high density of negatively charged hydroxyl groups on the surface anionic surfactants such as SDS showed much poorer reliability than cationic surfactants such as DD50. On the other hand, on a SAM treated, $NH_3^+$ terminated glass surface, SDS showed much better reliability than DD50 (FIG. 15). This is interpreted in terms of the surfactant modifying a surface region of finite width around the edge of the first droplet that exerts a repulsive force when the second droplets attempts to spread into this surrounding region. This surface modification might occur when the first droplets recede somewhat on the substrate during drying, before the contact line becomes fixed, or by diffusion of the surfactant out of the region occupied the first droplet. The surfactant might also adhere to the surface during the spreading of the droplet and force the contact line to recede a bit→"autophobing". The ability to modify the surface of the substrate in a region surrounding the first droplet appears to be enhanced if the head group has a charge that is opposite to that of functional groups on the surface of the substrate.

The ability of the surfactant to modify the surface of the substrate was verified directly by infrared spectroscopy (FIG. 15b). When a negatively charged, $O_2$ plasma treated substrate was dipped into a solution of DD50, infrared spectra taken after the dipping showed evidence for bonding of the DD50 molecules to the substrate surface. The characteristics signature of DD50 was observed even after rinsing the substrate in water. On a positively charged surface no evidence for DD50 deposition was observed. Analogous results were obtained for SDS.

Figure 16:
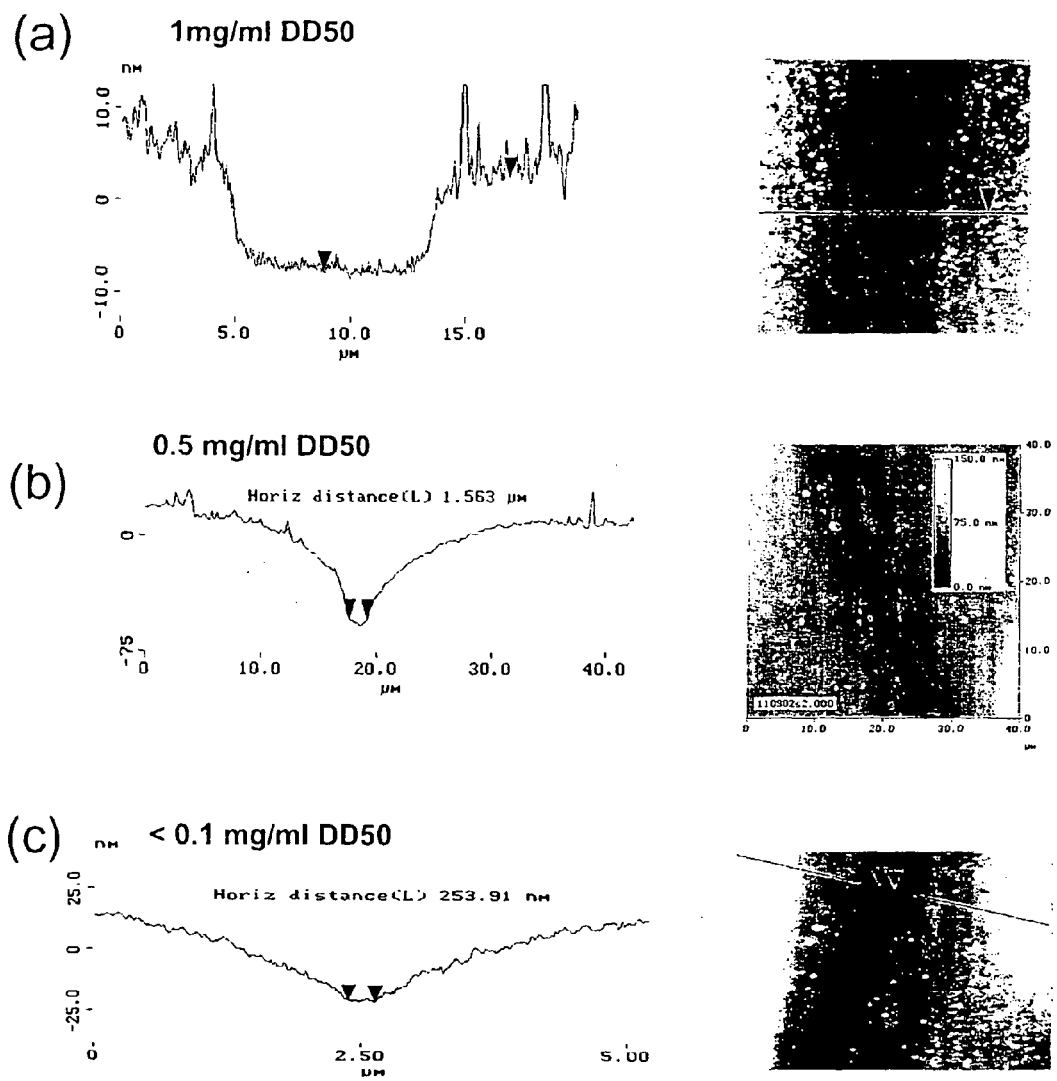
FIG. 16 shows output and transfer characteristics of bottom-gate P3HT TFTs fabricated by the self-aligned printing method on top of a PMMA gate dielectric (concentration of DD50<1 mg/ml).

Further evidence for surface modification of the substrate in a region around the droplet was obtained by varying the concentration of the surfactant in the solution of the first PEDOT electrode. It was found that the smaller the concentration of DD50 in the PEDOT solution the smaller the gap formed between the first and second electrodes. FIG. 16 shows atomic force microscopy images of self-aligned source drain electrode with different concentrations of DD50. In this experiment the PEDOT ink of the first and second electrodes were identical. The safety distance for printing was $\Delta=20\,\mu m$. For a concentration of 1 mg/ml the self-aligned gap between the two electrodes was on the order of 10 μm, for a concentration the gap was on the order of 2 μm, and for a concentration less than 0.1 mg/ml the gap was 200-400 nm. This shows that the gap size can be controlled with the surfactant concentration. It also gives further evidence that the surfactant acts to modify the surface region immediately adjacent to the droplets.

Figure 17:
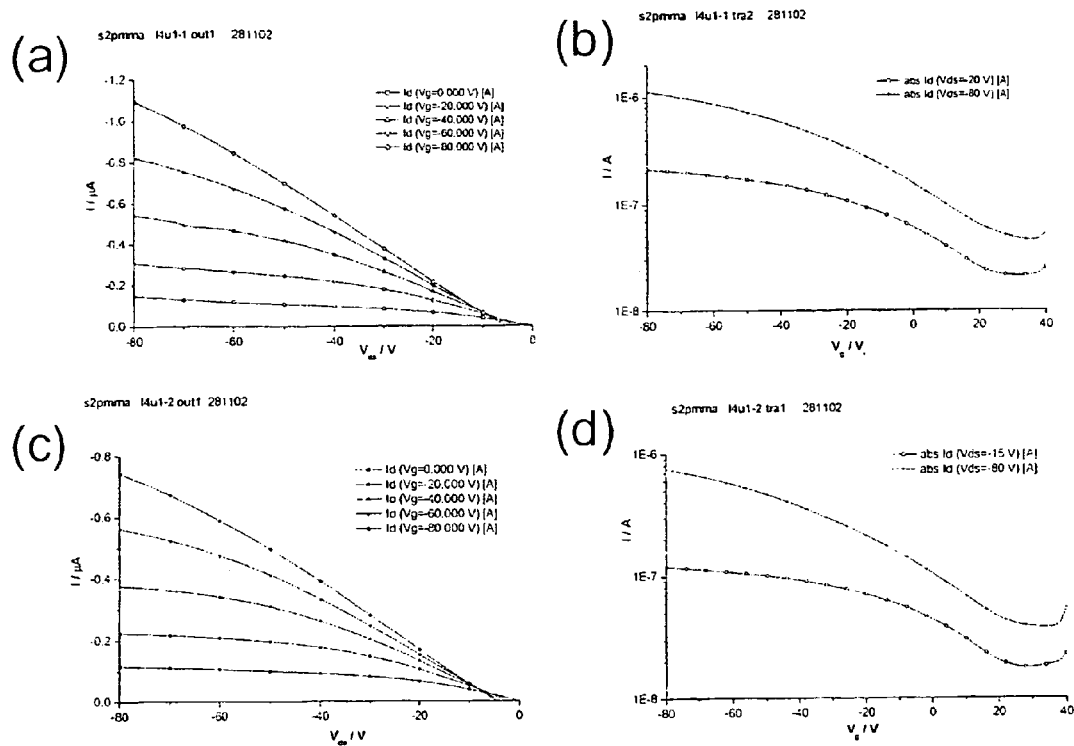
FIG. 17 shows current voltage characteristics measuring the conductivity of the source and drain contacts and the conductivity across the self-aligned gap of self-aligned PEDOT/PSS electrodes fabricated with a PVP-PEDOT/PSS mixture.

FIG. 17 shows output and transfer characteristics of two TFTs with a printed bottom-gate PEDOT electrode, a 1 μm thick PMMA dielectric layer deposited from butyl acetate, self-aligned PEDOT source-drain electrodes deposited from a solution with a concentration of <0.1 mg/ml of DD50, and a P3HT semiconducting layer spin-coated from m-xylene on top. The PMMA surface was exposed to a 100 W for 30 s prior to the self-aligned printing. The channel length in this device was on the order of 200-400 nm, the channel width on the order of 50 μm. Clean p-type field-effect operation is observed, the field-effect mobility extracted from the saturated transfer characteristics is on the order of $10^{-3}$ cm$^2$/Vs.

EXAMPLE 3

Surfactant-free PEDOT/PSS Inks

Experiments similar to the one described in Example 2 were also performed with PEDOT/PSS inks that did not contain any surfactant. In this case it was observed that on $O_2$ plasma treated glass substrates the process did not work, i.e. whenever the second droplet came in touch with the first droplet during spreading on the substrate, it wetted the first droplet, and an electrical short was generated.

However, on a PMMA surface that was treated with a 100 W $O_2$ plasma treatment for 30 s, we observed that if the printing distance was controlled very carefully, i.e., $\Delta=20\,\mu m$ was sufficiently large, such that the spreading second droplet had a slow contact line velocity when coming in contact with the first droplet, formation of a small gap on the order of 200 nm resulted without electrical shorts. This shows that under accurate printing conditions the surface of PEDOT/PSS itself, i.e. without additional surfactant, provides a sufficiently strong repulsive force between the first and second PEDOT droplets. This is believed to be related to the tendency of PEDOT to phase-separate. Upon drying the surface becomes enriched with the more hydrophobic PSSH component. A second possible reason for the repulsive force might be the existence of a modified surface region around the edge of the first droplet. This modified surface region might have been formed by deposition of some hydrophobic component, such as protonated PSSH, from the PEDOT solution onto the surface of the substrate, while the first droplet recedes during drying of the solution, or by deposition of hydrophobic material during the drying of the precursor wetting layer. Note that on a PMMA substrate the contact angle of PEDOT in water is significantly higher than on a glass substrate. The tendency of PEDOT/PSS to exhibit a hydrophobic surface is enhanced by annealing treatment of the first PEDOT pattern prior to deposition of the second one.

EXAMPLE 4

Self-aligned Printing by Vertical Phase Separation

Devices were also fabricated by inkjet printing of the first electrode from a formulation of PEDOT/PSS in water mixed with a solution of PVP in isopropanol (6.3 mg/ml PVP in PEDOT 1:1; with 80% $H_2O$ and 20% IPA). PVP was chosen because its surface is less polar than that of PEDOT/PSS, and PVP can be dissolved in alcohol solvents that are miscible with water, i.e. PVP can be codeposited with PEDOT/PSS. During the drying of the solution on a glass substrate the PVP component segregates to the surface and forms a hydrophobic surface coating around the first droplet. It was observed that the vertical phase separation between PEDOT/PSS and PVP could be enhanced by post-deposition annealing of the first printed electrode. Annealing under an atmosphere of isopropanol solvent at temperatures of 60° C. (for 6 hours) was found to be particularly effective. The solvent is believed to enhance the mobility of the polymer during the annealing step.

Figure 18:
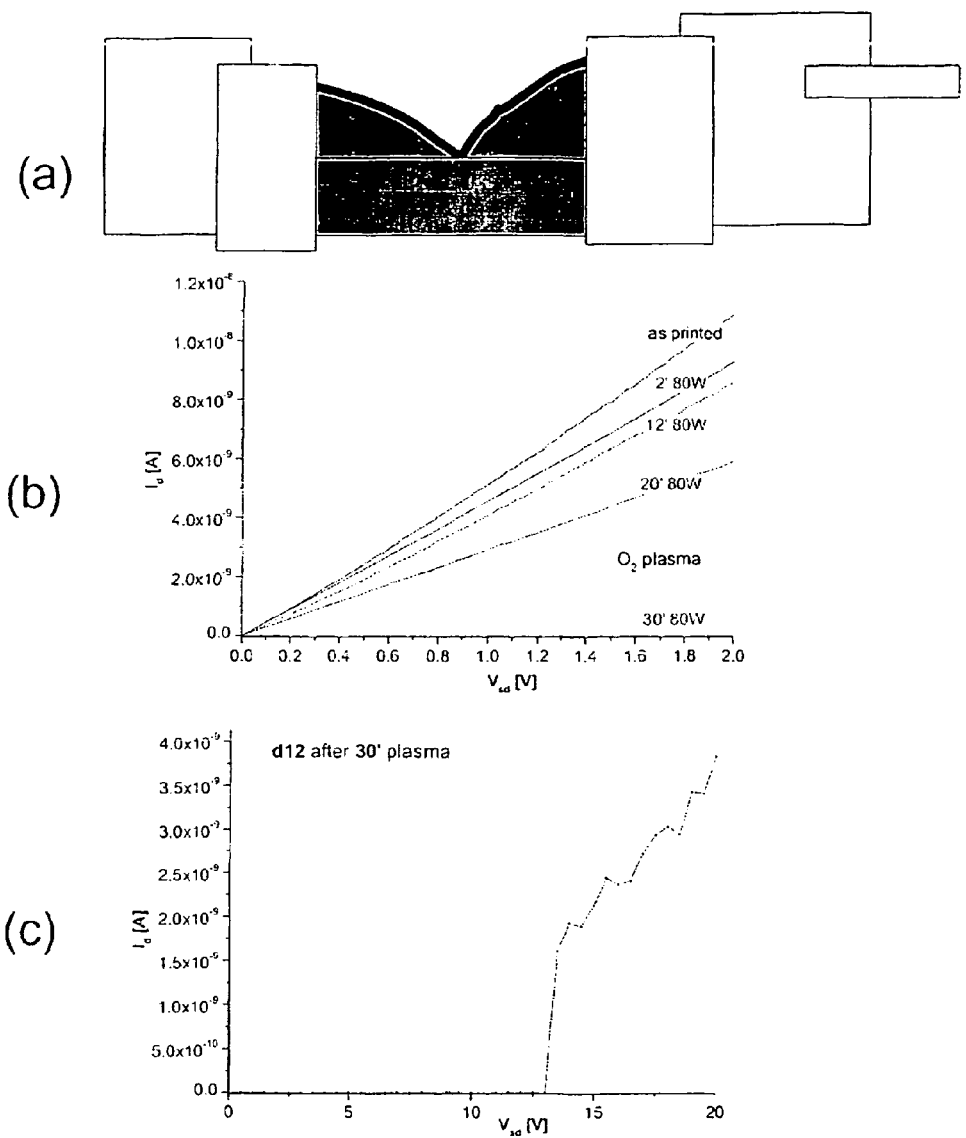
FIG. 18 shows output and transfer characteristics of self-aligned, top-gate F8T2 TFT with a PVP-PEDOT/PSS first electrode.

When the second droplet of PEDOT/PSS in water (not containing PVP) was printed in contact with the first droplet very efficient repulsion between the two droplets was observed. FIG. 18(a) shows measurements of the electrical conductivity measured with two electrical probes both placed on the first PEDOT/PVP droplet, both placed on the second PEDOT droplet, and one electrode placed on the first PEDOT/PVP droplet and the other one placed on the second PEDOT droplet, showing that no electrical short is present between the first and second droplet. The conductivity of the first PEDOT/PVP droplet is reduced by a factor of 2-3 with respect to the second pure PEDOT droplet. FIG. 18(b) shows that the leakage current between the first and second droplet can be reduced by solvent annealing of the first droplet after deposition.

Figure 19:
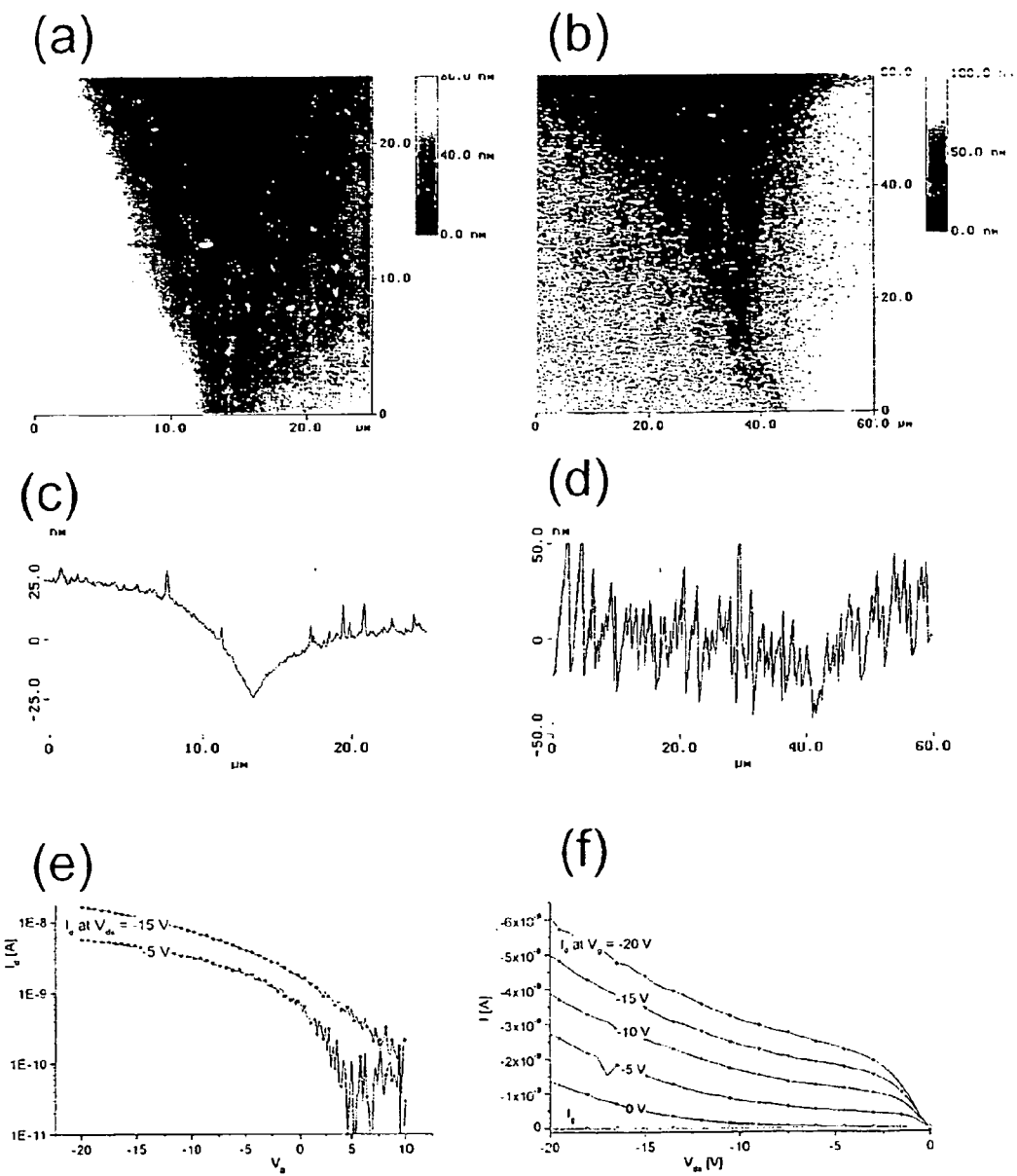
FIG. 19 shows the reduction of conductivity of an initially shorted PEDOT/PSS source-drain electrode upon exposure to an $O_2$ plasma.

FIG. 19 shows output and transfer characteristics of top-gate F8T2 devices with a first PEDOT/PVP electrode, but otherwise fabricated in the same way as described in Example 3. When the first PEDOT/PVP electrode is used as the charge injecting source electrode, the current is reduced by a factor of 2-3 compared to operation of the device with the second pure PEDOT second electrode used as the source electrode. This shows that the thin insulating PVP film on the surface of the first electrode contributes to the contact resistance of the device. This problem can be overcome by using the second electrode as the source, because the source electrode tends to be more sensitive to contact resistance as it is the reverse biased electrode. In addition, the contact resistance can be reduced by minimizing the concentration of PVP in the formulation of the first droplet, or by selectively dissolving the PVP surface layer, such as by dipping the substrate into a bath of isopropanol or other alcohols after deposition of the second electrode.

EXAMPLE 5

Removal of Shorts by Etching

As mentioned above with some surfactants and printing conditions electrical shorts were observed between some first and second droplets in contact with each other. However, even in such cases it was observed that the thickness of the region of contact between the two droplets was much smaller than the thickness of the two droplets in their centre. The two droplets exhibit a thickness profile with a continuously decreasing thickness towards the line of contact between the two droplets (see AFM micrographs in FIG. 21).

Figure 20:
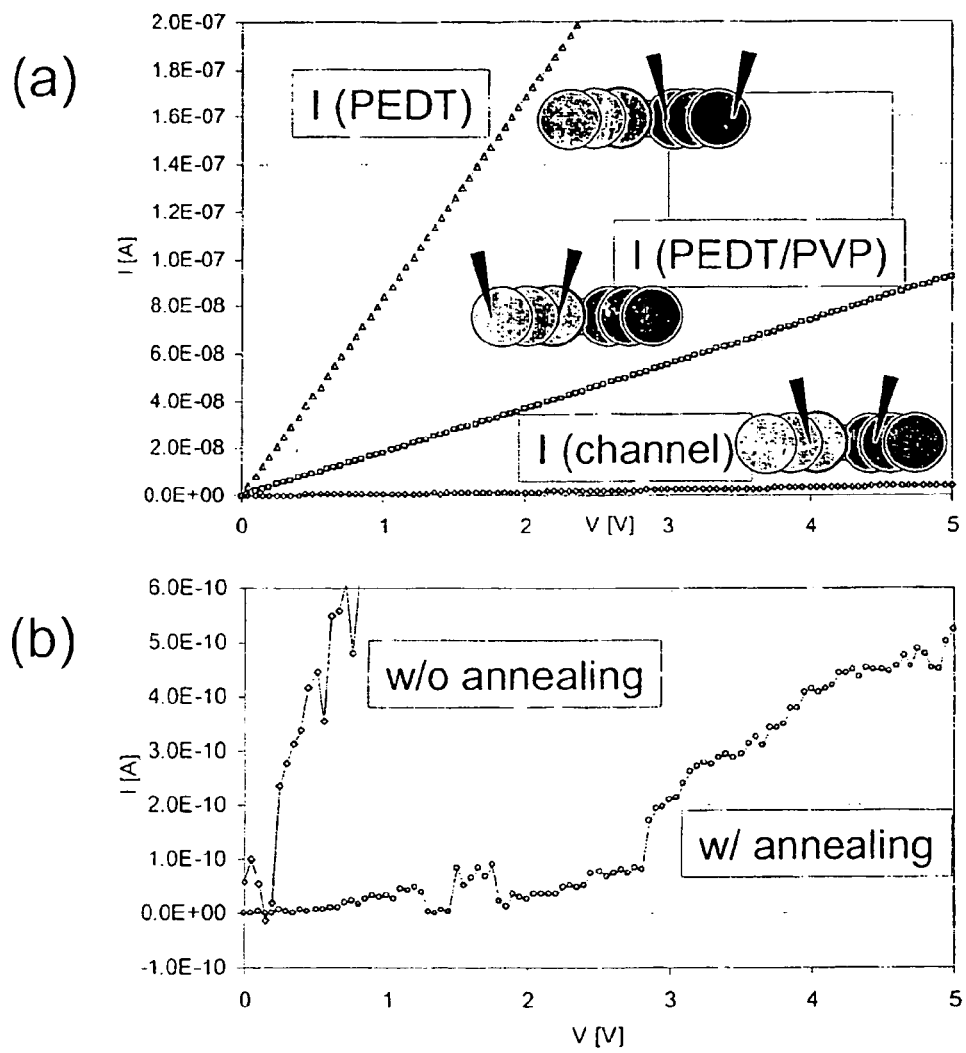
FIG. 20 shows atomic force micrographs of an initially shorted (a.) and c.)) and $O_2$ plasma etched source-drain electrode (b.) and d.)) as well as output and transfer characteristics of a top-gate F8T2 TFT after $O_2$ plasma etching.
Figure 21:
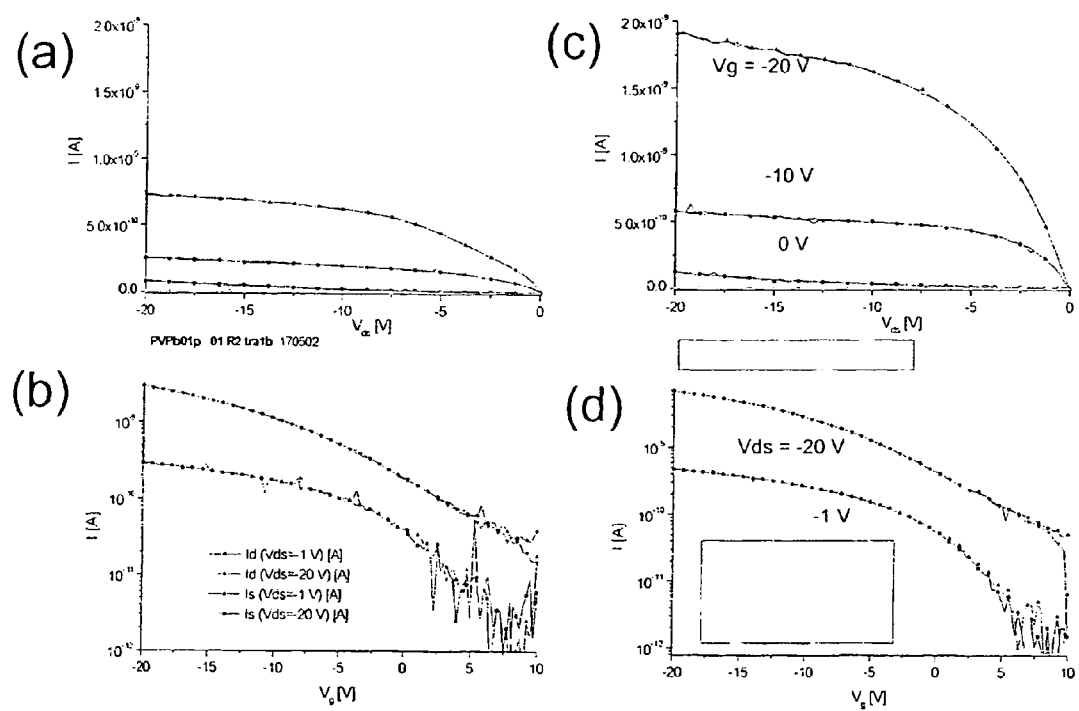
FIG. 21 shows (a) optical micrographs of self-aligned PEDOT/PSS droplets deposited from anionic SDS and cationic DD50 surfactant on a positively charged, $NH_3^+$ terminated surface and a negatively charged $OH^-$ surface, and (b) an infrared spectrum of a $Si/SiO_2$ surface dipped into a solution of DD50 before and after rinsing in deionized water.

We found that the electrical shorts can be removed by etching of the samples. The etching process removes a PEDOT layer of a given thickness from the surface (see schematic diagram in FIG. 20(a)). While in the centre of the droplets this does not affect the conductivity significantly, at the line of contact the etching process completely removes all conducting material, and the electrical short is removed. By exposing droplets that were shorted after the deposition to an oxygen plasma of 80 W for different times we observed that as a function of the etching time the conductivity measured between the two PEDOT droplets decreased continuously until after 30 min no current flow could be observed across the junction (FIGS. 20(b) and (c)). FIG. 21 shows atomic force micrographs of an initially shorted pair of droplets after the deposition ((a) & (c)) and after an 80 W $O_2$ plasma treatment for 30 min ((b) & (d)). After the oxygen plasma treatment the surface roughness is enhanced., The gap between the first and second droplet is so small that it is not detectable by atomic force microscopy, but the electrical measurements in FIG. 20 clearly shows that a gap exists.

FIGS. 20(e) and (f) show output and transfer characteristics of a top gate field-effect transistor with a pair of initially shorted self-aligned PEDOT source-drain electrodes on a glass substrate. The device was fabricated after subjecting the shorted electrodes to an $O_2$ plasma etching treatment. The semiconducting polymer of F8T2 and the PVP gate dielectric were spin coated from solutions in m-xylene and butyl acetate, respectively, on top of the PEDOT source-drain electrodes. The device exhibits clear short-channel characteristics, such as a lack of current saturation in the output characteristics, and a reduction of the ON-OFF current ratio with increasing source-drain voltage.

EXAMPLE 6

Post-deposition Surfactant Treatment of PEDOT

Efficient repulsion between the first and second PEDOT droplets has also been achieved by exposing the surface of the first PEDOT electrode to a solution of a surfactant prior to deposition of the second PEDOT droplet. A first pattern of PEDOT/PSS (1 part Baytron PH:1 part $H_2O$) is deposited on an $O_2$ plasma treated glass substrate. The substrate is then annealed at a temperature of 150° C. for 20 min. Then the substrate is immersed in a solution of the cationic surfactant didecyldimethylammonium bromide in water (concentration of 1-1.5 mg/ml) or the fluorinated cationic surfactant [3[[(heptadecafluorooctyl)sulfonyl]amino]propyl] trimethylammonium iodide for 5-10 min. Afterwards the substrate is rinsed in isopropanol or water.

Then the second PEDOT electrode is applied by inkjet printing. Very efficient repulsion is observed. Even if the second droplet, is printed on top of the first pattern the second droplet flows off the surface of the first droplet, and dries in a region adjacent to the first droplet with a small gap of less than 10 μm formed between the two droplets.

It was observed that the water contact angle of a PEDOT/PSS surface treated with DD50 in this way is 105°±5° compared to a water contact angle of <10° observed for unmodified PEDOT/PSS. For surfactant modified PEDOT/PSS the water contact angle is stable over a period of at least several minutes, while on an unmodified PEDOT/PSS the contact angle decreases in time, which is indicative of dissolution of the PEDOT film into the water droplet. Such dissolution does not appear to occur in the case of the surfactant modified PEDOT/PSS surface.

Alternative post-deposition of the first PEDOT pattern can also be achieved using self-assembled monolayers that bind covalently to surface groups on the PEDOT/PSS surface. A fluoroalkyl mono- or trichlorosilane self-assembled monolayer reacts selectively with the PEDOT surface, but does not modify a modified glass substrate surface terminated by positively charged $NH_3+$groups or a PMMA substrate surface.

EXAMPLE 6

Surface Modification by Polymer Brush Growth

Polymer brushes can be grown in a controlled way from surfaces by functionalizing a surface with a chain polymerization initiator. This chain polymerisation can be a controlled radical polymerization such as Atom Transfer Radical Polymerization (ATRP) and the initiator would be a 2-bromo-2-methylpropionic ester derivative.

To anchor this initiator to the surface of PEDOT, the surface of the PEDOT is first oxidized by $O_2$ plasma to introduce surface —OH groups. The activated surface can then be reacted with trichlorosilane derivatives containing the above mentioned initiator. Alternatively, initiator functionalized surfactant-like molecules can be mixed into the PEDOT solution, which then form a surface monolayer upon drying the PEDOT film on a surface, exposing the initiator on the surface. A third way of introducing the initiator on the surface of PEDOT is by synthesizing PEDOT derivatives that contain the initiator functionality.

The initiator-functionalized PEDOT film is exposed to a solution containing monomer (in the case of ATRP this can be any acrylate or methacrylate), catalyst (Cu(I)Cl or Cu(I)Br), and ligands (PMDETA, bipyridine, or another known and suitable ligand to solubilize the Cu salts). Optionally, solvents can be used (polar solvents like water and methanol will speed up the reaction greatly, ethylacetate and toluene are two other well-known solvents). To control the reaction with greater precision, Cu(II) salts can be added.

The surface is left in the polymerization medium for a set amount of time, after which the excess monomer and catalyst is rinsed off the surface and the polymer brushes remain behind. In the case of a polymer brush of PMMA grown off the surface of a PEDOT/PSS first electrode, the PMMA provides a hydrophobic surface coating which efficiently repels droplets for the second PEDOT/PSS electrode pattern.

One general criterion for choosing surfactant molecules for the self-aligned fabrication of electronic device according to the present invention, that contamination of the device by ionic impurities stemming from the polar group of the surfactant should be minimized. This can be achieved by using small surfactant concentrations, or by using non-ionic surfactants. Furthermore diffusion of the surfactant under the action of the electric fields during device operation or during prolonged operation can be reduced by using surfactant with higher molecular weight such as polymeric surfactants.

A class of surface modifying agents that is particularly effective in repelling the second droplet are fluorinated surface modifying agents such as anionic or cationic fluorinated surfactants. On a fluorinated surface of a first PEDOT droplet high water contact angles close to 100° can be achieved.

The processes and devices described herein are not limited to devices fabricated with solution-processed polymers. Some of the conducting electrodes of the TFT and/or the interconnects in a circuit or display device (see below) may be formed from inorganic conductors, that can, for example, be deposited by printing of a colloidal suspension or by electroplating onto a pre-patterned substrate. In devices in which not all layers are to be deposited from solution one or more PEDOT/PSS portions of the device may be replaced with an insoluble conductive material such as a vacuum-deposited conductor.

For the semiconducting layer any solution processible conjugated polymeric or oligomeric material that exhibits adequate field-effect mobilities exceeding $10^{-3}$ cm$^2$/Vs, preferably exceeding $10^{-2}$ cm$^2$/Vs, may be used. Suitable materials are reviewed for example in H. E. Katz, J. Mater. Chem. 7, 369 (1997), or Z. Bao, Advanced Materials 12, 227 (2000). Other possibilities include small conjugated molecules with solubilising side chains (J. G. Laquindanum, et al., J. Am. Chem. Soc. 120, 664 (1998)), semiconducting organic-inorganic hybrid materials self-assembled from solution (C. R. Kagan, et al., Science 286, 946 (1999)), or solution-deposited inorganic semiconductors such as CdSe nanoparticles (B. A. Ridley, et al., Science 286, 746 (1999)).

The electrodes may be coarse-patterned by techniques other than inkjet printing. Suitable techniques include soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), and photolithographic patterning (see WO 99/10939), offset printing, flexographic printing or other graphic arts printing techniques. Ink-jet printing is considered to be particularly suitable for large area patterning with good registration, in particular for flexible plastic substrates.

Although preferably all layers and components of the device and circuit are deposited and patterned by solution processing and printing techniques, one or more components such as a semiconducting layer may also be deposited by vacuum deposition techniques and/or patterned by a photolithographic process.

Devices such as TFTs fabricated as described above may be part of a more complex circuit or device in which one or more such devices can be integrated with each other and or with other devices. Examples of applications include logic circuits and active matrix circuitry for a display or a memory device, or a user-defined gate array circuit.

The patterning process may be used to pattern other components of such circuit as well, such as interconnects, resistors, capacitors etc.

The present invention is not limited to polymer transistor devices. The application is applicable wherever structures with narrow gaps between two printed patterns are required. Any of the first and second materials can be an inorganic material, such as a solution processible inorganic conductor, such as colloidal silver or copper ink, a solution processed inorganic semiconductor, such as solubilized inorganic nanocrystals, or a solution processible inorganic dielectric such as spin-on glass. The device may be any device for which controlled patterning and small feature sizes are required such as a light-emitting or photovoltaic device.

Figure 13:
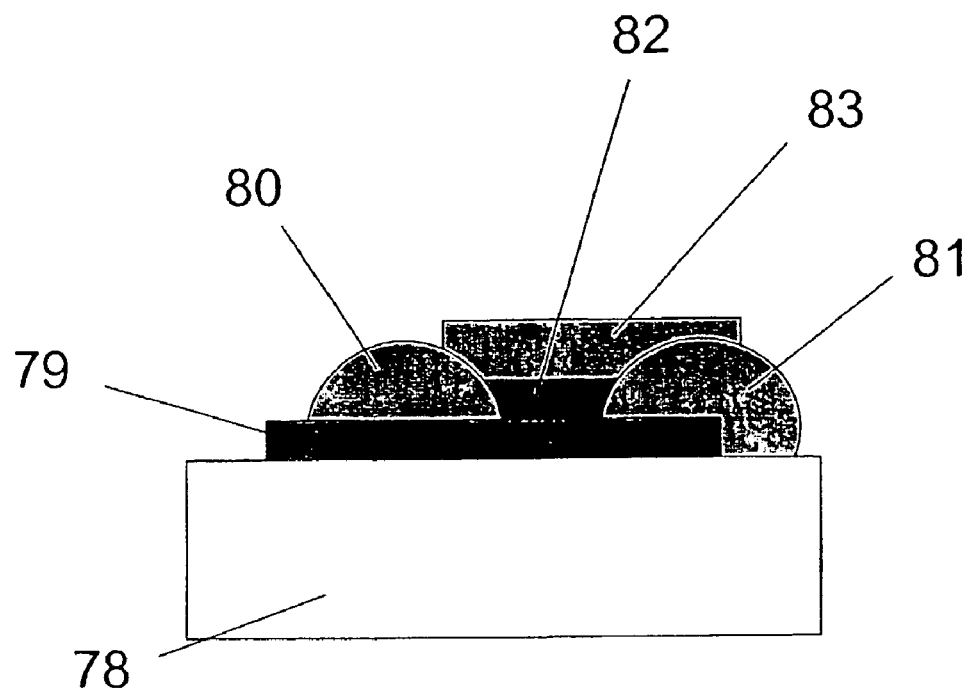
FIG. 13 shows the structure of a self-aligned LED or photodiode with a small active area.

As an example the active area of a small-area LED or photodiode can be defined by printing at least one semiconducting light-emitting material 82 into the self-aligned small gap between a first 80 and second confinement barrier 81. The substrate contains a hole injecting anode 79, and on the top of the device an electron injecting cathode layer 83 is deposited (FIG. 13).

Other examples of potential applications of the present invention are in conventional graphic arts printing, whenever narrow gaps between two printed patterns are required, or printed patterns with a narrow width, that cannot be achieved without the use of surface energy patterning.

The technique disclosed in this invention enables high yield, high resolution printing that requires no surface energy pre-patterning to direct the solution processible material into position.

The present invention is not limited to the foregoing examples. Aspects of the present invention include all novel and/or inventive aspects of the concepts described herein and all novel and/or inventive combinations of the features described herein.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A method of forming an electronic device, comprising:
   forming a first body having a first composition on a first region of a substrate;
   subsequently depositing a liquid of a second composition in contact with the first body to form a second body not in contact with the first body on a second region of the substrate adjacent the first region; and
   preparing the surface of the first body prior to the deposition of the liquid of the second composition to repel the liquid of the second composition,
   wherein the shortest distance between the first and second bodies defines a dimension of a critical feature of the electronic device, and wherein the first body forms an active feature of the electronic device.

2. A method according to claim 1, wherein the step of preparing the surface of the first body includes selecting the composition of the first body such that the surface thereof repels the liquid of the second composition.

3. A method according to claim 1, wherein the electronic device is a field effect transistor and the critical feature is the channel length of the FET.

4. A method as claimed in claim 3, comprising the additional step of depositing a solvent on top of the first and second body, wherein said solvent dissolves a layer on the substrate in the region between the edge of the first and second body.

5. A method as claimed in claim 4, wherein said dissolution opens up a via-hole interconnection to a conducting layer that is part of the substrate layer structure, and further conducting material is deposited into the region between the first and second body to fill the via-hole interconnection.

6. A method as claimed in claim 5, wherein the diameter of said via-hole interconnection is less than 20 μm.

7. A method as claimed in claim 1, wherein the first composition is a solution of at least two components having a tendency to segregate.

8. A method as claimed in claim 7, wherein one of the components is a polymer with a tendency to segregate to the surface of the first composition.

9. A method as claimed in claim 7, wherein one of the components is a diblock copolymer comprising a relatively polar and a relatively non-polar block.

10. A method as claimed in claim 7, wherein one of the components is a surfactant.

11. A method as claimed in claim 1, comprising treating the first body prior to deposition of the liquid of the second composition so as to modify at least one physical or chemical property of the surface of the first body.

12. A method as claimed in claim 11, wherein the property is composition.

13. A method as claimed in claim 11, wherein the property is surface roughness.

14. A method as claimed in claim 11, wherein the property is surface energy.

15. A method as claimed in claim 11, wherein the step of treating the surface of the first body does not modify the surface energy of the substrate in the second region.

16. A method as claimed in claim 11, wherein the contact angle of the liquid of the second composition on said treated surface of the first body is higher by more than 10° than that on the surface of the substrate in the second region.

17. A method as claimed in claim 11, wherein the contact angle of the liquid of the second composition on said treated surface of the first body is higher by more than 40° than that on the surface of the substrate in the second region.

18. A method as claimed in claim 11, wherein the contact angle of the liquid of the second composition on said treated surface of the first body is higher by more than 70° than that on the surface of the substrate in the second region.

19. A method as claimed in claim 11, wherein the step of treating the surface of the first body comprises increasing the density of fluorinated or alkylated chemical groups on the surface of the first body.

20. A method as claimed in claim 11, wherein the step of surface treating the first body comprises applying a surfactant to the surface of the first body.

21. A method as claimed in claim 20, wherein the surface of the first body comprises positively charged ionic species.

22. A method as claimed in claim 21, wherein the surfactant is an anionic surfactant.

23. A method as claimed in claim 20, wherein the surface of the first body comprises negatively charged ionic species.

24. A method as claimed in claim 23, wherein the surfactant is a cationic surfactant.

25. A method as claimed in claim 24, wherein said layer of a different composition is a polymer brush.

26. A method as claimed in claim 23, wherein said layer of a different composition is a polymer layer.

27. A method as claimed in claim 20, wherein the surface of the substrate is subjected to a thermal treatment or exposure to electromagnetic radiation prior to application of said surfactant.

28. A method as claimed in claim 11, wherein the step of treating the surface of the first body comprises growing a layer of a different composition off the surface of the first composition.

29. A method as claimed in claim 11, wherein the step of treating the surface of the first body comprises exposing the substrate to a plasma treatment.

30. A method as claimed in claim 29, wherein said plasma treatment comprises exposure to a plasma containing a fluorinated species.

31. A method as claimed in claim 30, wherein said plasma treatment comprises exposure to $CF_4$ or a radical of $CF_4$.

32. A method as claimed in claim 31, comprising the additional step of removing the material of the first body in the surrounding region after the deposition of the second body.

33. A method as claimed in claim 32, wherein said step of removing the material of the first body in the surrounding region involves etching.

34. A method as claimed in claim 11, wherein the step of surface treating the first body comprises dedoping the surface of the first body or depleting the surface of the first body of charge carriers.

35. A method as claimed in claim 11, wherein the step of surface treating the first body comprises etching the surface of the first body.

36. A method as claimed in claim 1, wherein the first composition comprises a solution of one or more materials in a solvent, which dries to form the first body; and the first body has a bulk region and a surrounding region around the periphery of the bulk region and in contact with the substrate.

37. A method as claimed in claim 36, wherein the width of said surrounding region is less than 20 μm.

38. A method as claimed in claim 36, wherein the surface energy in the surrounding region is different from that of the substrate surface in a region not covered by the first body.

39. A method as claimed in claim 36, wherein the surface roughness in the surrounding region is different from that of the substrate surface in the second region.

40. A method as claimed in claim 36, wherein the thickness of the first body in the surrounding region does not exceed 80% of the greatest thickness of the first body in said bulk region.

41. A method as claimed in claim 36, wherein the solution of the first composition recedes from the surrounding region during the drying of the solution of the first composition.

42. A method as claimed in claim 36, wherein the solution of the first composition comprises a surface modifying component that modifies the surface energy of the substrate in the surrounding region.

43. A method as claimed in claim 42, wherein the surface modifying component modifies the surface energy of the substrate while the solution of the first composition recedes from the surrounding region.

44. A method as claimed in claim 42, wherein the surface modifying component diffuses out of said bulk region into said surrounding region.

45. A method as claimed in claim 36, wherein prior to the deposition of the liquid of the second composition, the substrate is heated to cause the first body to recede from the surrounding region.

46. A method as claimed in claim 36, wherein the method comprises treating the surface of the first body in the surrounding region, so as to increase the contact angle of the solution of the second composition in the surrounding region.

47. A method as claimed in claim 36, wherein the substrate has a surface layer that dissolves into the solution of the first composition during the drying of the solution of the first composition, thereby uncovering the underlying material of the substrate in said surrounding region.

48. A method as claimed in claim 1, wherein the liquid of said second composition comprises a surfactant.

49. A method as claimed in claim 1 in which the first body is in a solid state while the liquid of the second composition is deposited.

50. A method as claimed in claim 1 in which the first body is in a liquid state while the solution of the second composition is deposited.

51. A method as claimed in claim 1, comprising confining the liquid of the second composition after depositing it on the substrate, so as to encourage the liquid of the second composition to contact the first body in a defined region of the first body.

52. A method as claimed in claim 1, wherein the liquid of at least one of the first or second composition is deposited by ink-jet printing.

53. A method as claimed in claim 1, wherein the liquid of at least one of the first or second composition is deposited by spray-coating.

54. A method as claimed in claim 1, wherein the liquid of at least one of the first or second composition is applied to the substrate as a continuous film, and the substrate contains regions of relatively low surface energy, that cause the liquid to dewet from said regions of relatively low surface energy.

55. A method as claimed in claim 1, wherein the liquid of the first composition is deposited by offset printing.

56. A method as claimed in claim 1, wherein the liquid of the second composition dries to form a second body and at least one of the first body and the second body is electrically conductive.

57. A method as claimed in claim 56, wherein both the first body and the second body are electrically conductive.

58. A method as claimed in claim 57, wherein the first and second body form electrodes of an electronic device.

59. A method as claimed in claim 58, wherein the first and second body form source and drain electrodes of an electronic switching device.

60. A method as claimed in claim 58, wherein the first and second body form source and drain electrodes of a thin film transistor.

61. A method as claimed in claim 56, wherein at least one of said first or second body comprises a conducting polymer.

62. A method as claimed in claim 56, wherein the liquid of the second composition dries to form a second body and at least one of the first and second bodies comprises a inorganic conductive material deposited from solution.

63. A method as claimed in claim 1, wherein the liquid of the second composition dries to form a second body and at least one of the first body and the second body is semiconductive.

64. A method as claimed in claim 63, wherein both the first body and the second body are semiconductive.

65. A method as claimed in claim 63, wherein at least one of the first body and the second body comprises a conjugated polymer.

66. A method as claimed in claim 63, comprising forming an electronic device having said semiconductive body as an active semiconducting layer thereof.

67. A method as claimed in claim 1, wherein the liquid of the second composition dries to form a second body and at least one of the first body and the second body is electrically insulating.

68. A method as claimed in claim 67, wherein both the first body and the second body are electrically insulating.

69. A method as claimed in claim 67, wherein at least one of said first or second body comprises an electrically insulating polymer.

70. A method as claimed in claim 1 wherein the distance between the edge of the first and second body is less than 20 µm.

71. A method as claimed in claim 1 wherein the distance between the edge of the first and second body is less than 1 µm.

72. A method as claimed in claim 1 wherein the distance between the edge of the first and second body is less than 100 nm.

73. A method as claimed in claim 1 wherein the distance between the edge of the first and second body is less than 10 nm.

74. A method as claimed in claim 1, comprising the additional step of depositing a solution of a third composition on top of the first and second body to form a third body in contact with the first and second body.

75. A method as claimed in claim 74, wherein the solution of said third composition is repelled by the surface of both the first and second body.

76. A method as claimed in claim 75, wherein the third body is confined to a region on the substrate between the edge of the first and second body.

77. A method as claimed in claim 74, wherein said third body is semiconducting.

78. A method as claimed in claim 74, wherein said third body is electrically conducting.

79. A method as claimed in claim 74, wherein said third body is electrically insulating.

80. An electronic device formed by a method as claimed in claim 1.

81. A logic circuit, display memory or sensor device formed by a method as claimed in claim 1.

82. A method of forming an electronic device, comprising:
forming a first body on a first region of the substrate; and
subsequently depositing a liquid of a second composition in contact with the first body to form a second body in contact with the first body on a second region of the substrate adjacent the first region,
wherein the first body has a non-conducting or semiconducting surface region whose thickness defines a dimension of a critical feature of the electronic device, and a conductive region underlying the non-conducting or semiconducting surface region.

83. A method as claimed in claim 3 or 82, wherein the liquid of the second composition is deposited in such a way that it comes in contact with the first body only at the periphery of the first region of the substrate.

84. A method as claimed in claim 1 or claim 82, wherein the first and second body consist essentially of the same material.

85. A method as claimed in claim 1 or claim 82, wherein the first composition has a tendency to segregate to form a surface region and an interior region of the first body, the surface region having a different composition from the interior region.

86. A method as claimed in claim 85, wherein the contact angle of the liquid of the second composition on said surface region is higher by more than 10° than that on the surface of the substrate in the second region.

87. A method as claimed in claim 86, wherein the contact angle of the liquid of the second composition on said surface region is higher by more than 40° than that on the surface of the substrate in the second region.

88. A method as claimed in claim 87, wherein the contact angle of the liquid of the second composition on said surface region is higher by more than 70° than that on the surface of the substrate in the second region.

89. A method as claimed in claim 86, wherein the liquid of a second composition comprises a solvent and said surface region is insoluble in the solvent.

90. A method as claimed in claim 85, wherein said surface region contains alkylated or fluorinated chemical groups.

91. A method, as claimed in claim 85, wherein said surface region of the first body is electrically insulating.

92. A method as claimed in claim 91, comprising forming an electronic device having said electrically insulating surface region as a dielectric layer thereof.

93. A method as claimed in claim 92, comprising forming a thin film transistor device having said electrically insulating surface region as a dielectric layer thereof.

94. A method as claimed in claim 85, wherein said surface region of the first body is electrically conducting.

95. A method as claimed in claim 94, comprising forming an electronic device having said electrically conducting surface region as an electrode therefor.

96. A method as claimed in claim 95, wherein said electrically conducting surface region forms an electrical injection layer for injecting charge into a semiconductive layer.

97. A method, as claimed in claim 85, wherein said surface region of the first body is semiconducting.

98. A method as claimed in claim 97, comprising forming an electronic device having said semiconductive surface region as an active semiconducting layer thereof.

99. A method as claimed in claim 98, wherein the electronic device is an electronic switching device.

100. A method as claimed in claim 99, wherein the electronic device is a thin film transistor.

101. A method as claimed in claim 85, comprising the step of removing the surface region of the first body after the deposition of the second body.

102. An electronic switching device comprising a source electrode, a drain electrode, a gate electrode, a semiconductor region electrically between the source electrode and the drain electrode and a dielectric region electrically between the semiconductor region and the gate electrode, the semiconductor region being in the form of a layer of substantially uniform thickness located over at least one of the source electrode and the drain electrode and being located physically between and adjacent to the source electrode and the drain electrode so as to separate the source electrode and the drain electrode such that at their closest proximity the source electrode and the drain electrode are spaced apart by the thickness of the said layer.

103. An electronic switching device comprising a source electrode, a drain electrode, a gate electrode, a semiconductor region electrically between the source electrode and the drain electrode and a dielectric region electrically between the semiconductor region and the gate electrode, the dielectric region being in the form of a layer of substantially uniform thickness and being:

located physically between and adjacent to the gate electrode and at least one of the source electrode and the drain electrode, so as to separate the gate electrode and the said one of the source electrode and the drain electrode such that at their closest proximity the gate electrode and the said one of the source electrode and the drain electrode are spaced apart by the thickness of the said layer; and located physically between and adjacent to the source electrode and the drain electrode, so as to separate the source electrode and the drain electrode such that at their closest proximity the source electrode and the drain electrode are spaced apart by the thickness of the said layer.

* * * * *